US012672368B2

(12) United States Patent  
Yoo et al.

(10) Patent No.: US 12,672,368 B2  
(45) Date of Patent: Jun. 30, 2026

(54) IMAGE SENSOR INCLUDING A PLURALITY OF PIXELS AND AT LEAST ONE LENS

(71) Applicant: SAMSUNG ELECTRONICS CO., LTD., Suwon-si (KR)

(72) Inventors: Hyungeun Yoo, Suwon-si (KR); Dongmin Keum, Suwon-si (KR); Jung-Saeng Kim, Suwon-si (KR); Bumsuk Kim, Suwon-si (KR); Yun Ki Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 18/790,612

(22) Filed: Jul. 31, 2024

(65) Prior Publication Data

US 2025/0048757 A1     Feb. 6, 2025

(30) Foreign Application Priority Data

Aug. 2, 2023     (KR) ........................ 10-2023-0101232

(51) Int. Cl.

| | |
|---|---|
| *H10F 39/00* | (2025.01) |
| *H04N 25/77* | (2023.01) |
| *H04N 25/78* | (2023.01) |
| *H10F 39/18* | (2025.01) |

(52) U.S. Cl.

CPC ........... *H10F 39/802* (2025.01); *H04N 25/77* (2023.01); *H04N 25/78* (2023.01); *H10F 39/182* (2025.01); *H10F 39/8063* (2025.01); *H10F 39/807* (2025.01)

(58) Field of Classification Search

CPC ...... H04N 25/46; H04N 25/704; H04N 25/77; H04N 25/778; H04N 25/78; H10F 39/182; H10F 39/802; H10F 39/8063; H10F 39/807

See application file for complete search history.

(56) References Cited

U.S. PATENT DOCUMENTS

| | | | | |
|---|---|---|---|---|
| 8,853,811 | B2 | 10/2014 | Lai et al. | |
| 11,075,236 | B2 * | 7/2021 | Shiraishi | H10F 39/12 |
| 2020/0235149 | A1 * | 7/2020 | Shiraishi | H10F 39/12 |
| 2022/0130876 | A1 * | 4/2022 | Park | H10F 39/182 |
| 2022/0181372 | A1 | 6/2022 | Lee et al. | |
| 2022/0199660 | A1 * | 6/2022 | Lee | H10F 39/802 |

(Continued)

FOREIGN PATENT DOCUMENTS

KR     10-2022-0159374 A     12/2022

*Primary Examiner* — Amy R Hsu

(74) *Attorney, Agent, or Firm* — Sughrue Mion, PLLC

(57) ABSTRACT

An image sensor is provided. The image sensor image sensor includes: a first pixel group including a first pixel, a second pixel, a third pixel and a fourth pixel; a second pixel group including a fifth pixel, a sixth pixel, a seventh pixel and an eighth pixel, wherein the second pixel group is provided adjacent to the first pixel in a first direction; a first lens corresponding to the first pixel and the second pixel; a second lens corresponding to the third pixel and the fourth pixel; a device isolation pattern electrically isolating the first pixel group from the second pixel group; and a readout circuit configured to: output phase data based on at least a portion of phase signals received from the first pixel group; and output image data based on at least a portion of color signals received from the second pixel group.

18 Claims, 17 Drawing Sheets

(56)     References Cited

U.S. PATENT DOCUMENTS

2022/0344389 A1*  10/2022  Pyo ..................... H10F 39/8023
2022/0415939 A1*  12/2022  Tanaka .................. H10F 39/014
2023/0143387 A1     5/2023  Matsumoto et al.

* cited by examiner

【FIG. 1】
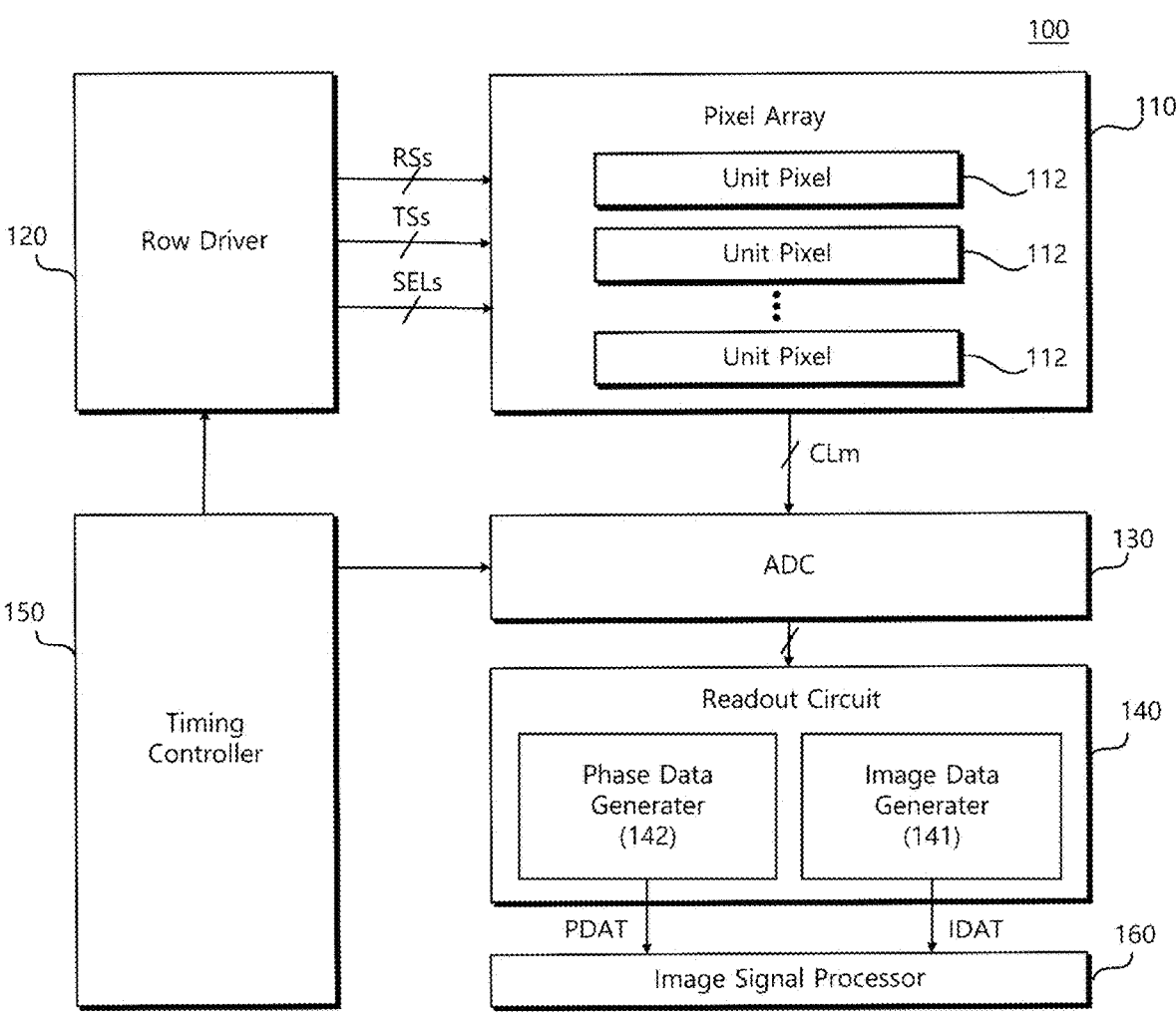

【FIG. 2a】
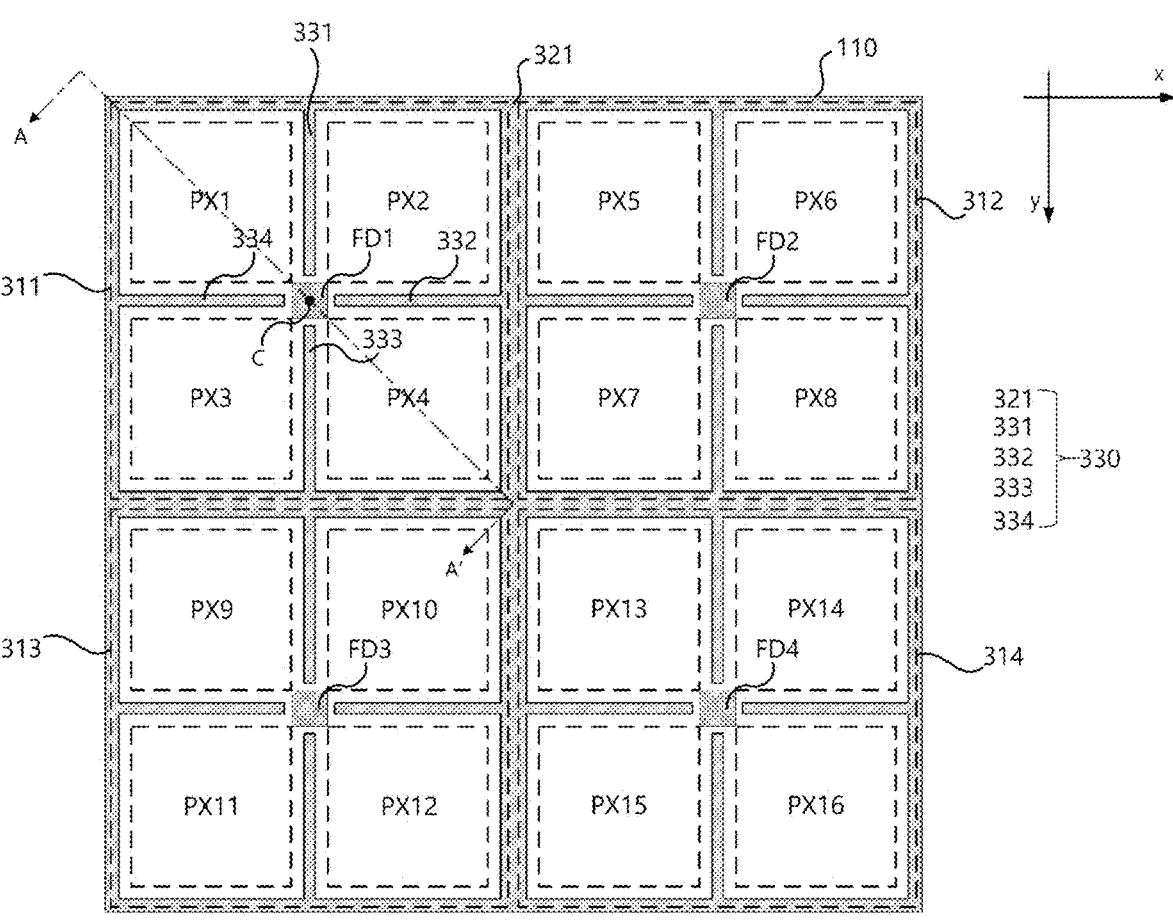

【FIG. 2b】
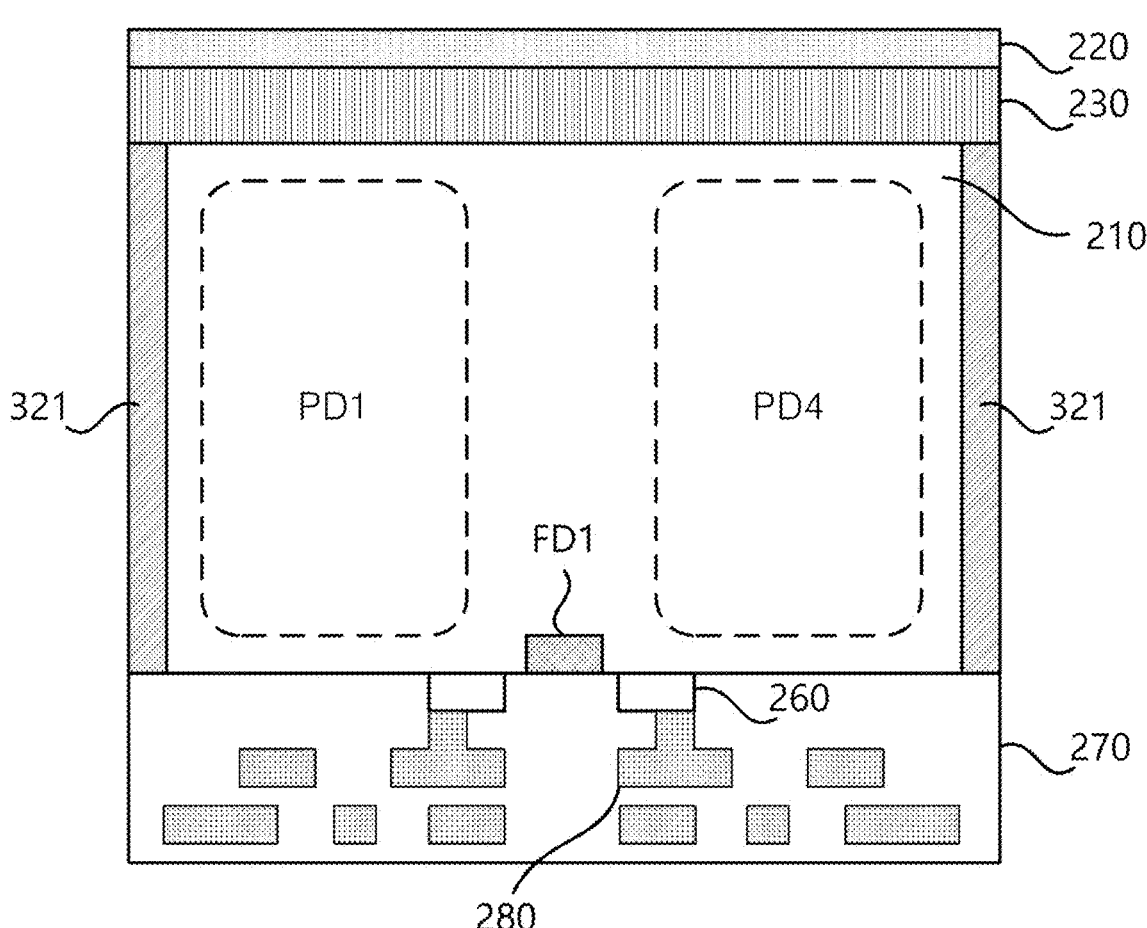

【FIG. 3】
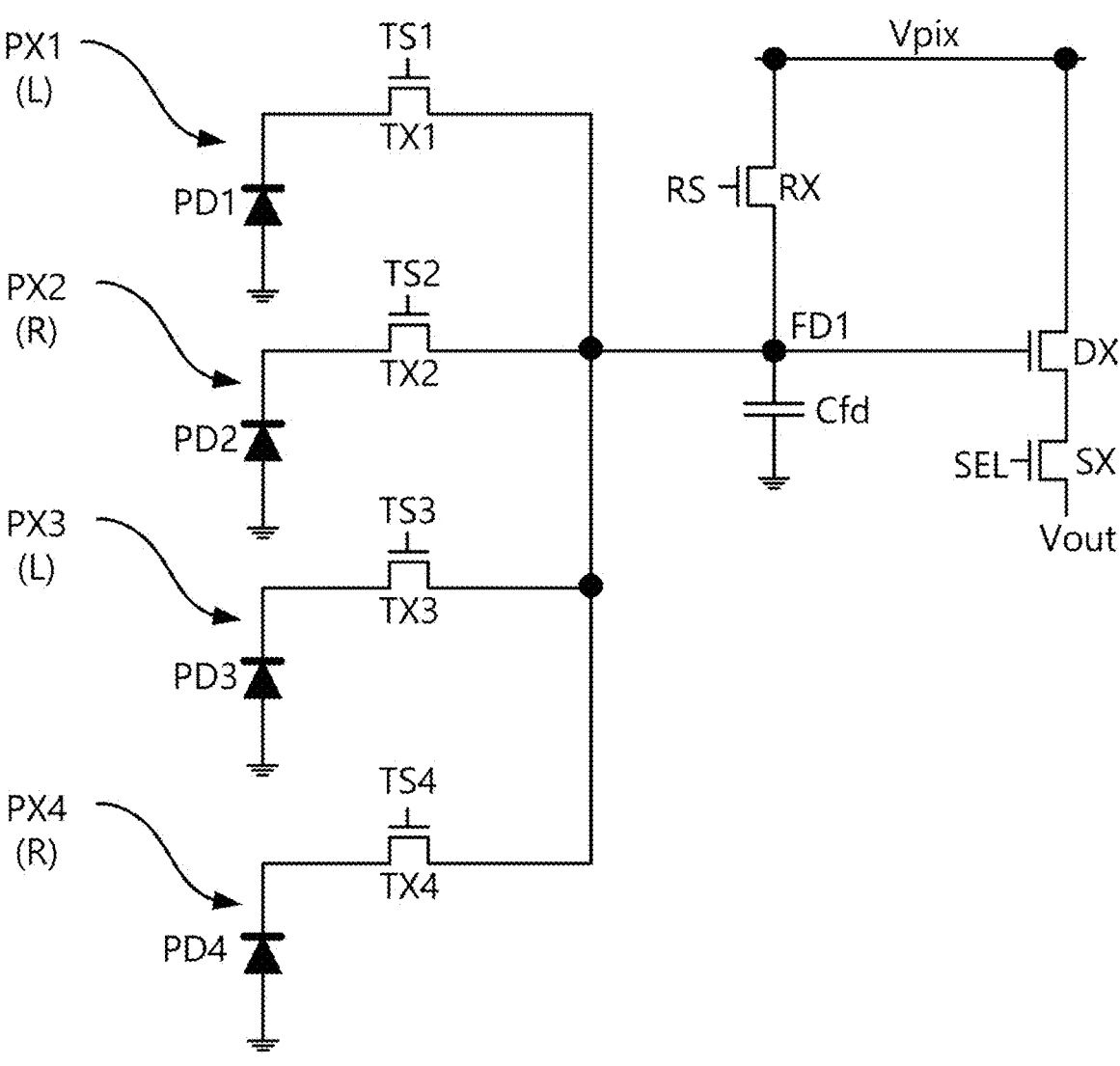

[FIG. 4a]
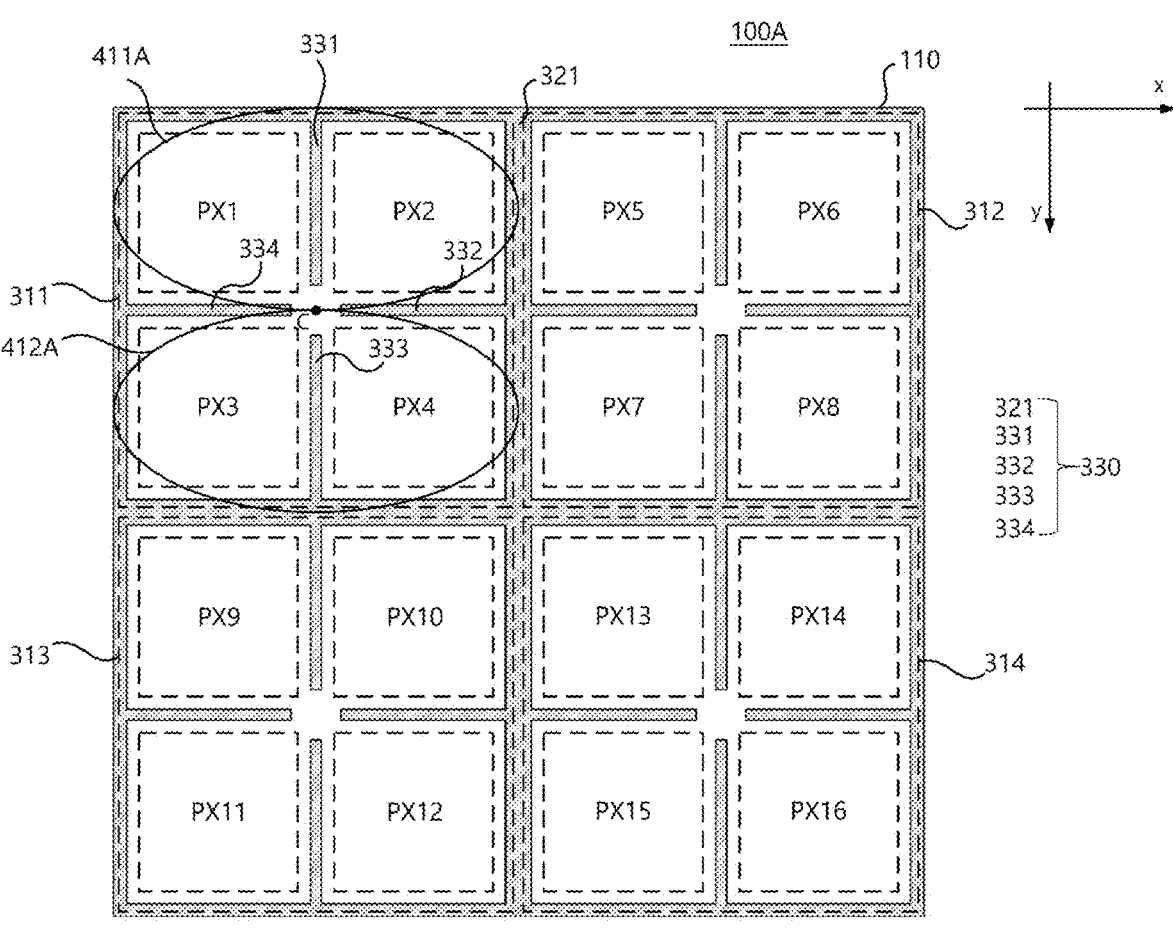

[FIG. 4b]
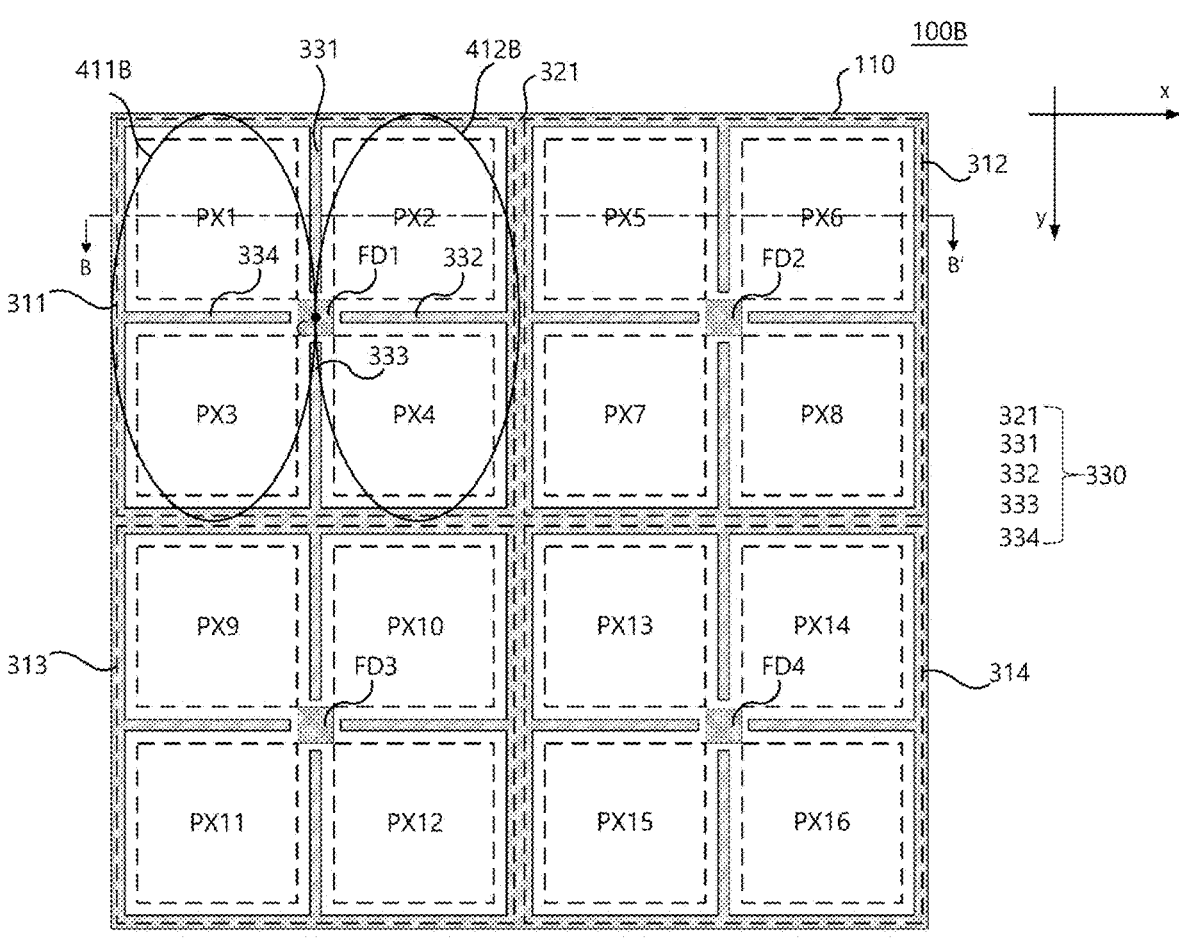

[FIG. 5]
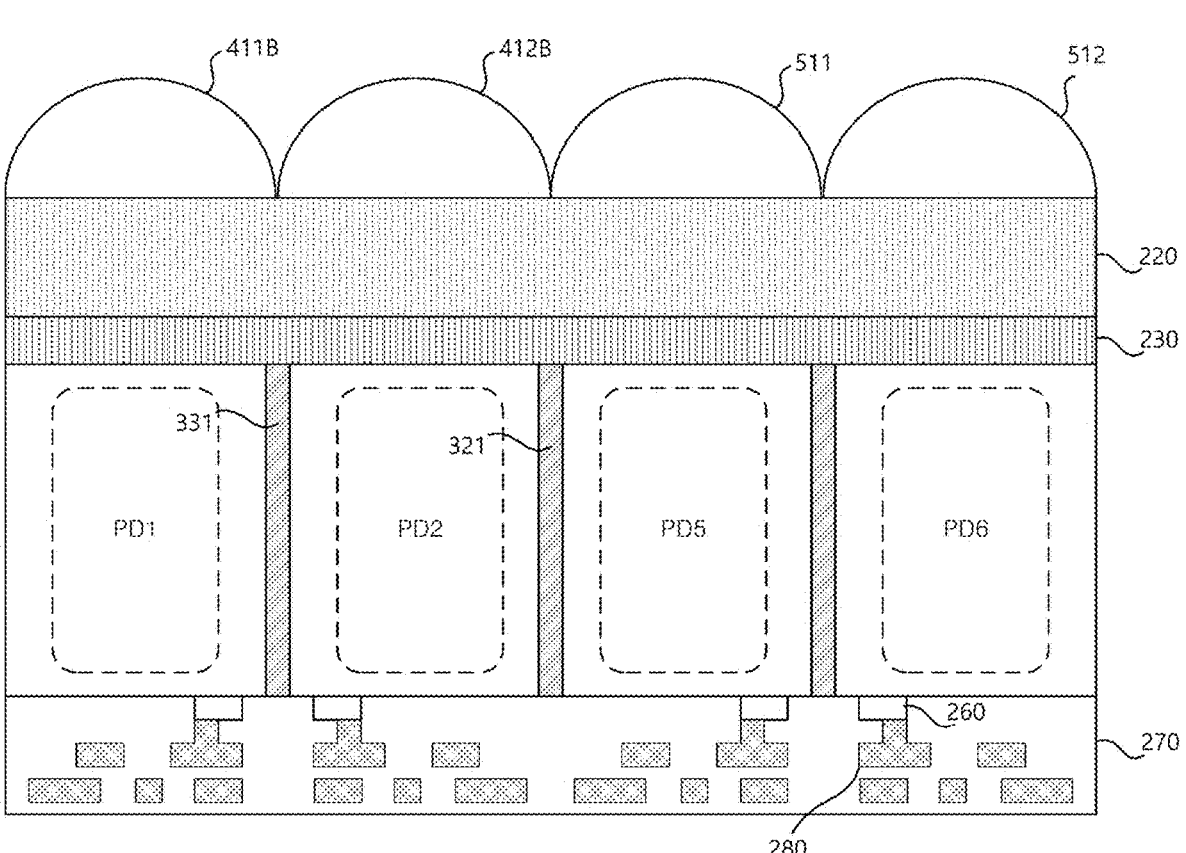

[FIG. 6a]
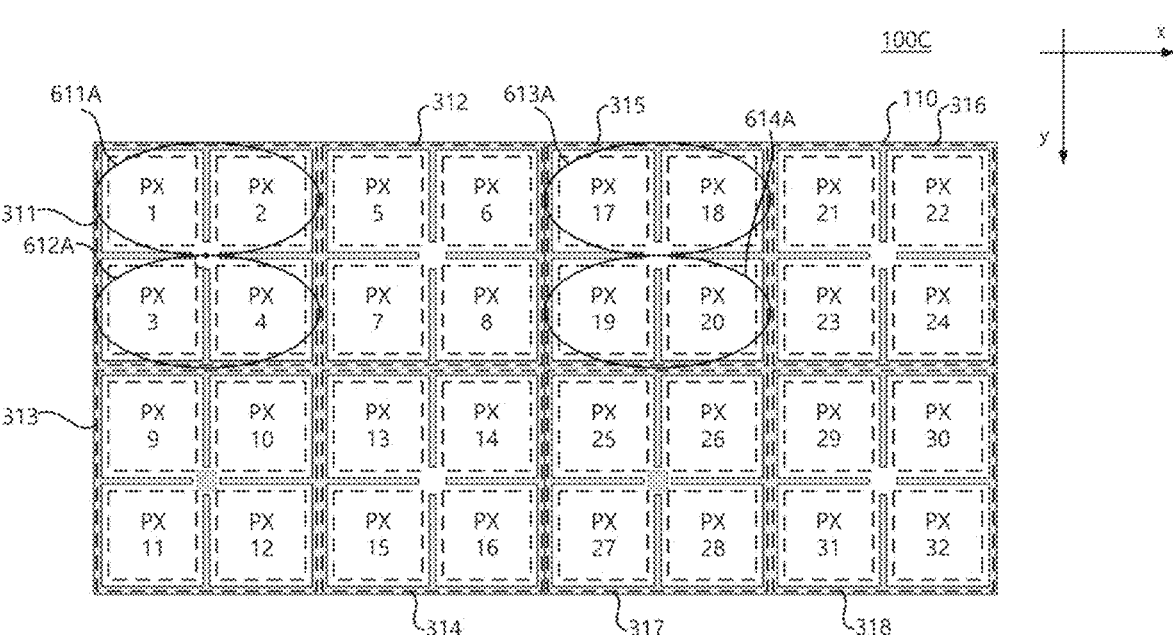

【FIG. 6b】
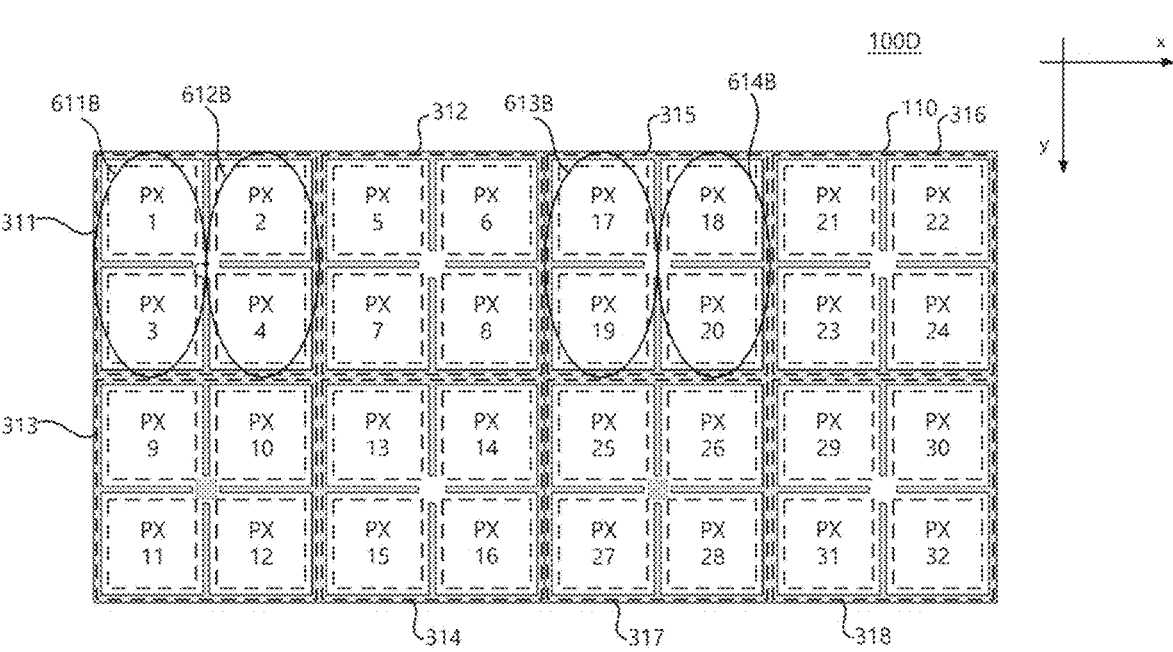

[FIG. 7a]
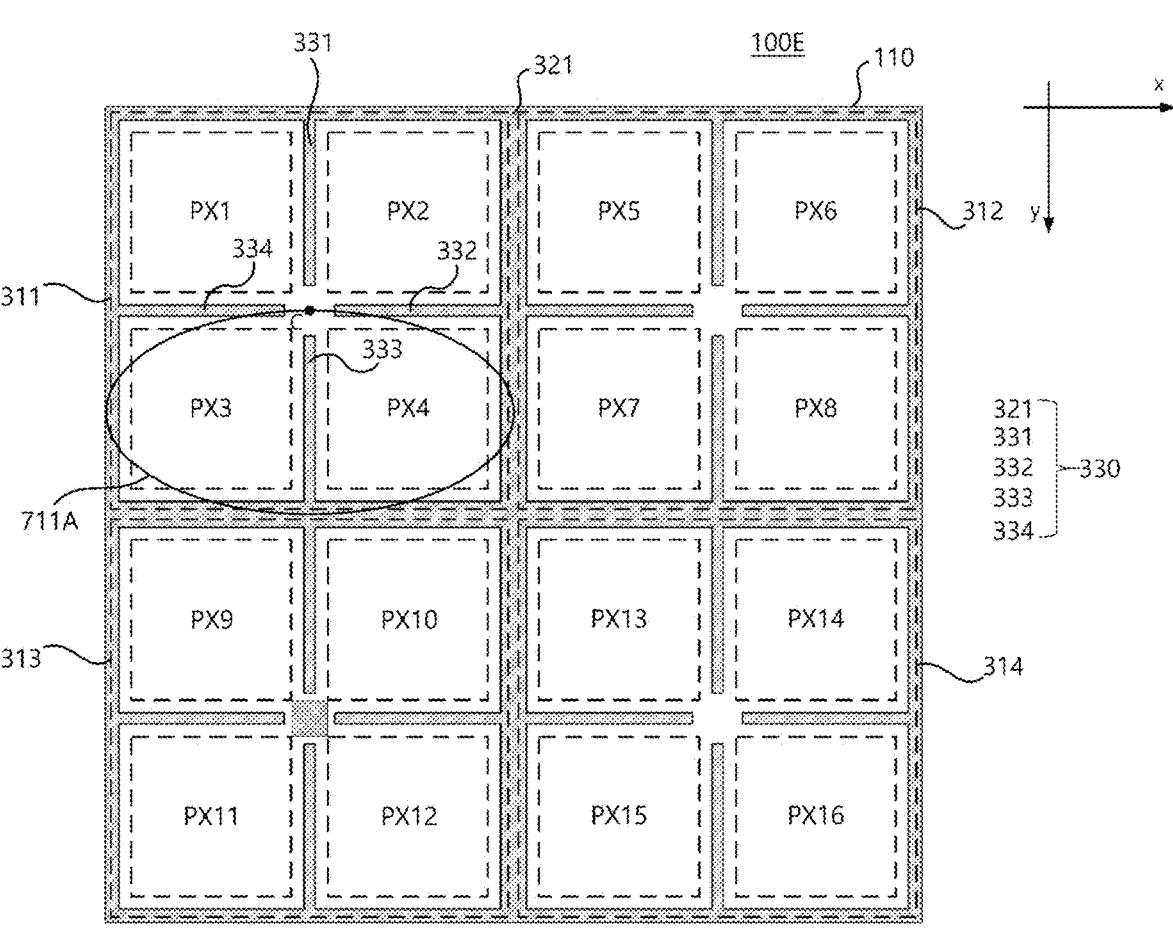

【FIG. 7b】
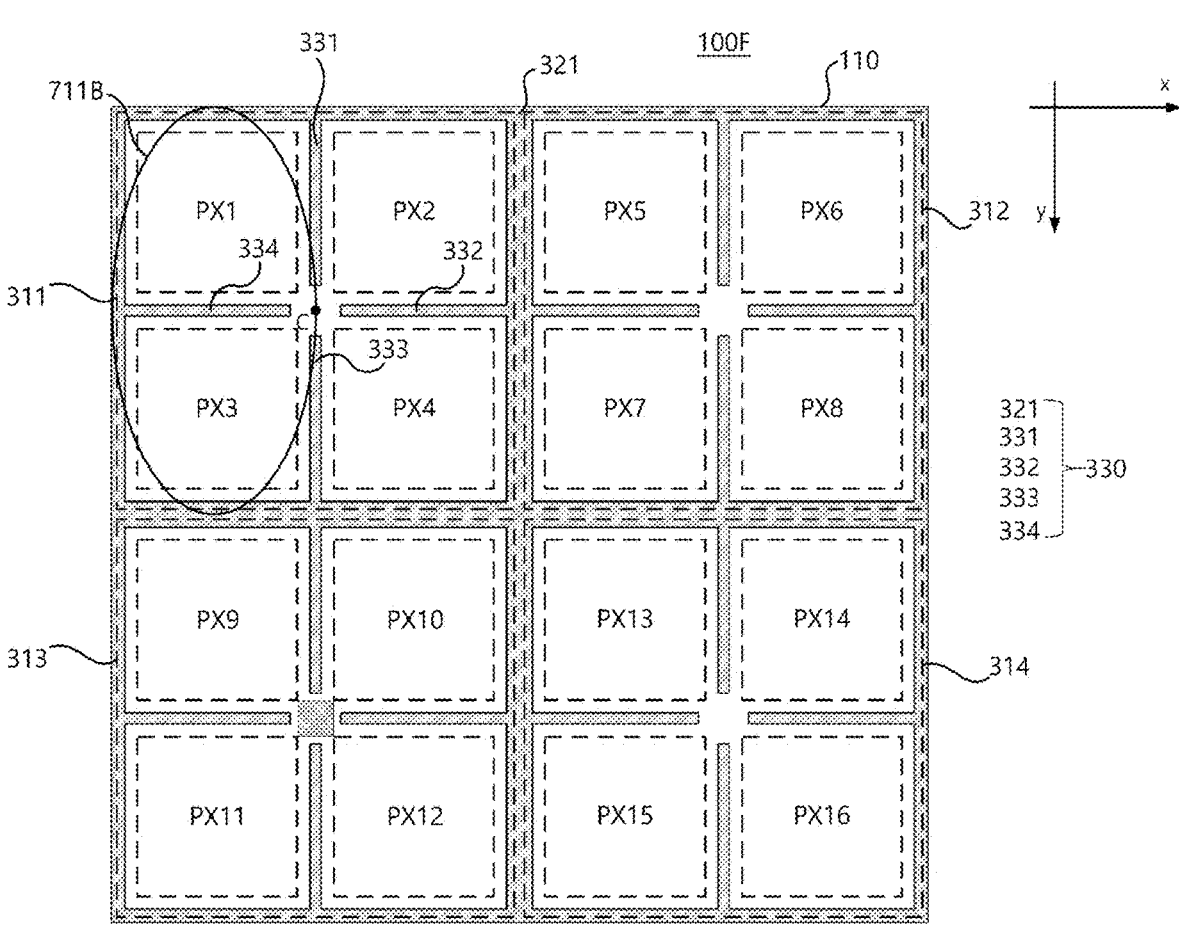

[FIG. 8a]
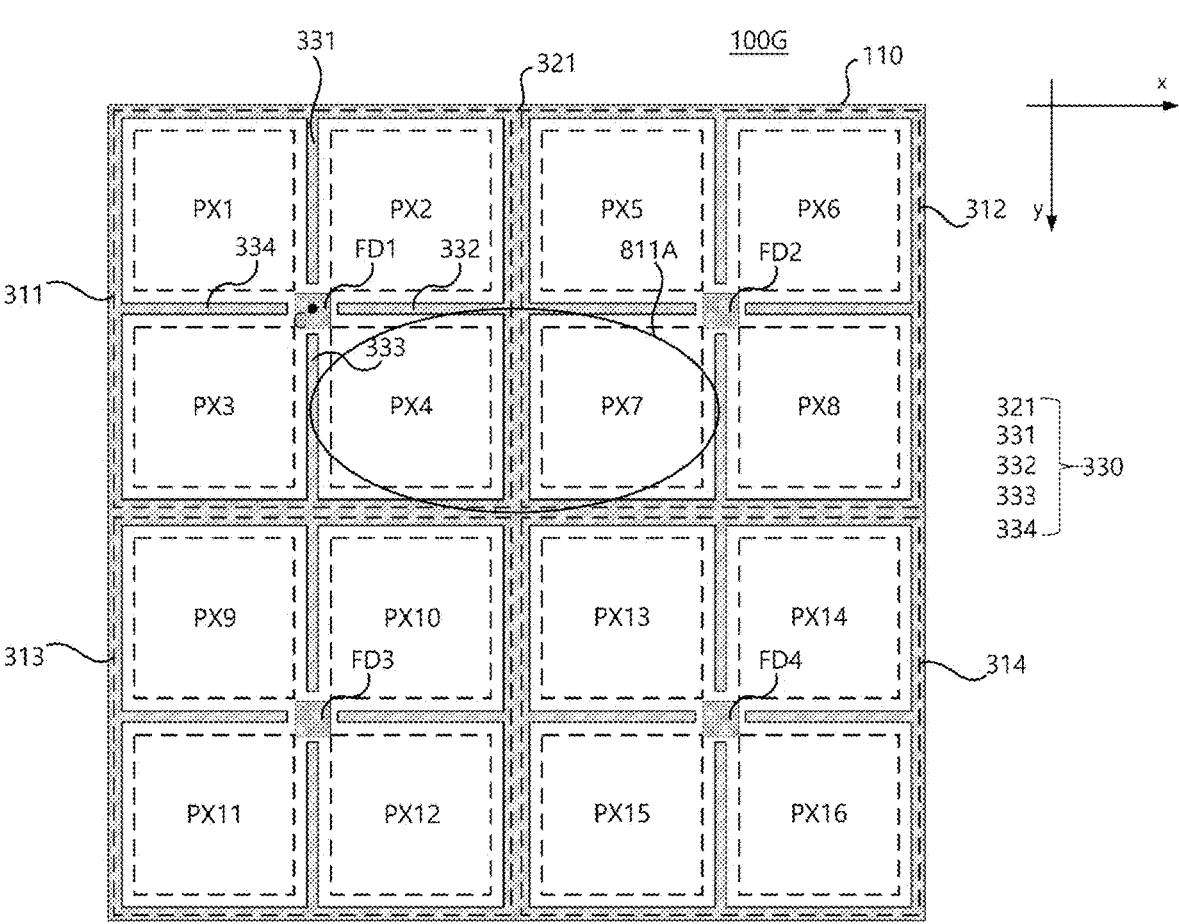

【FIG. 8b】
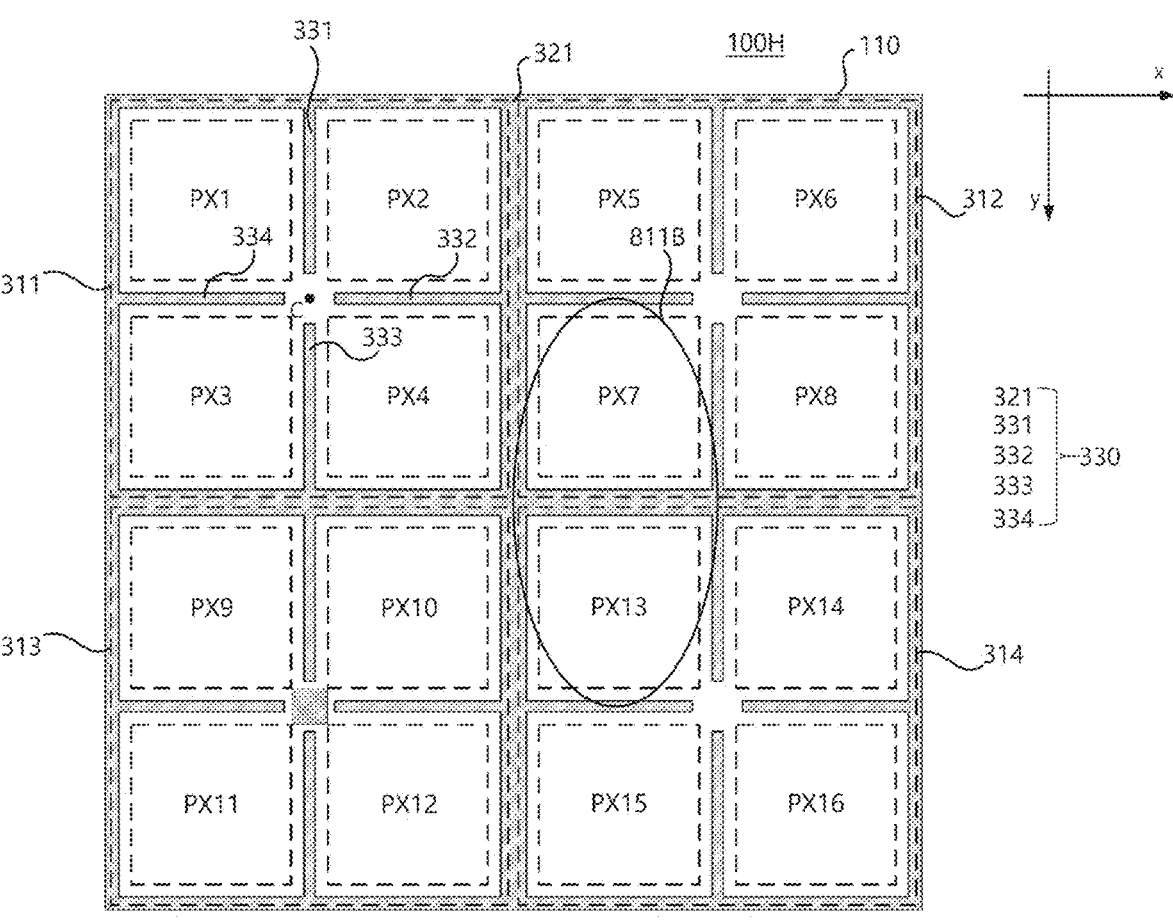

【FIG. 9a】
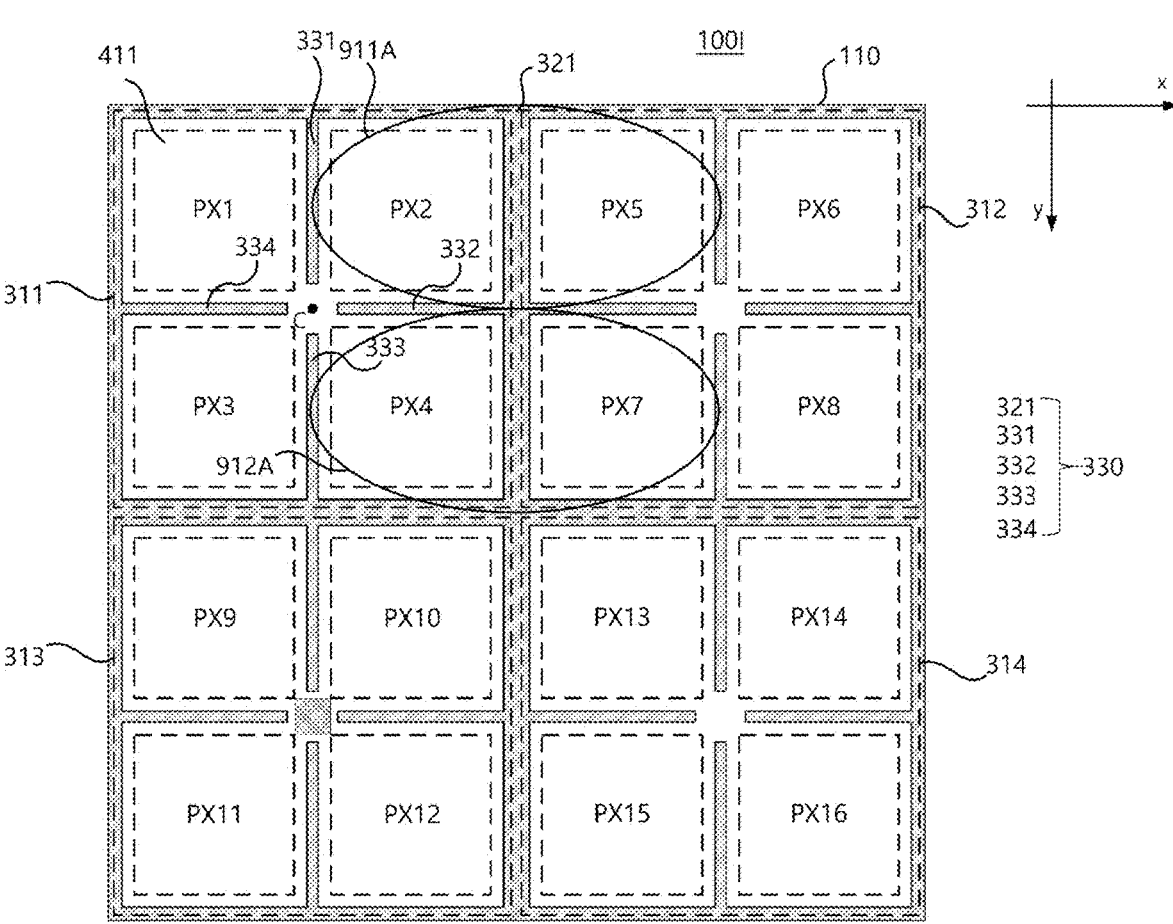

[FIG. 9b]
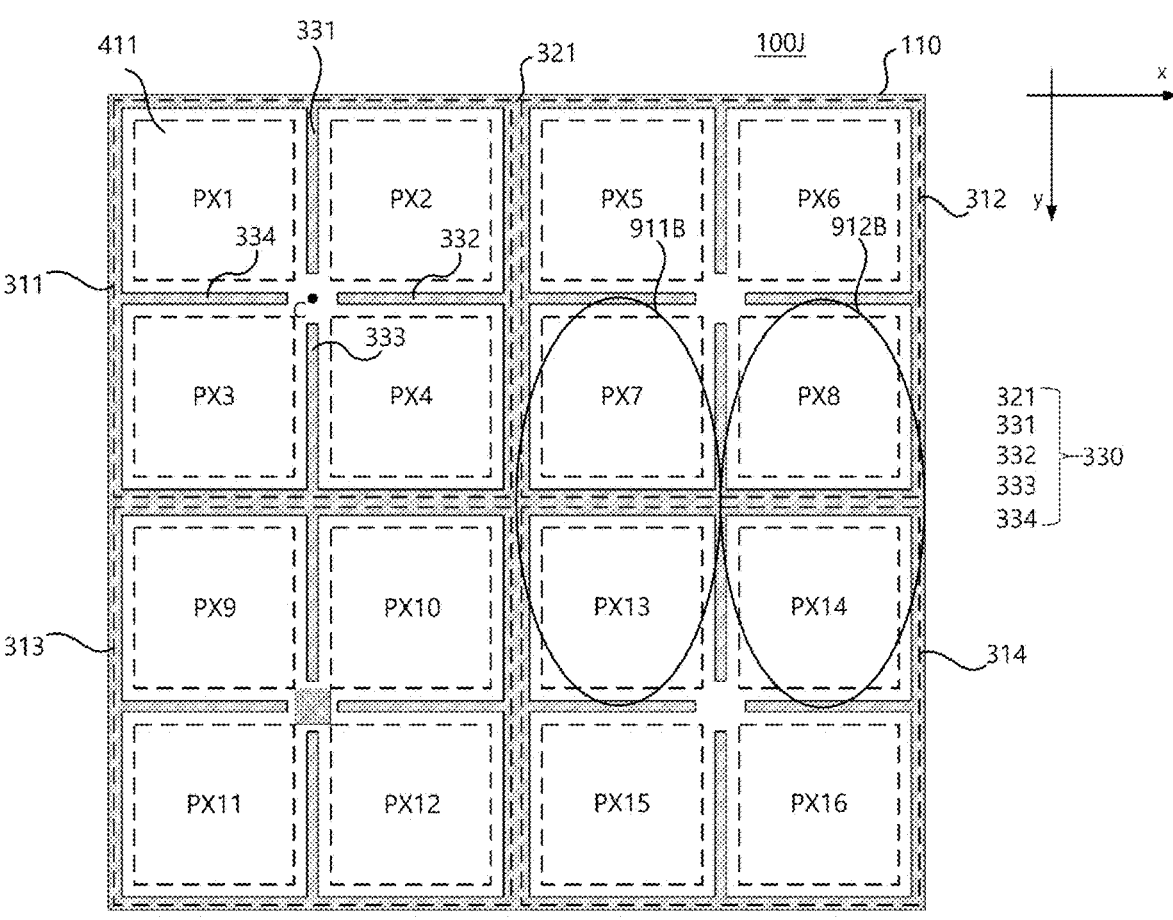

[FIG. 10]
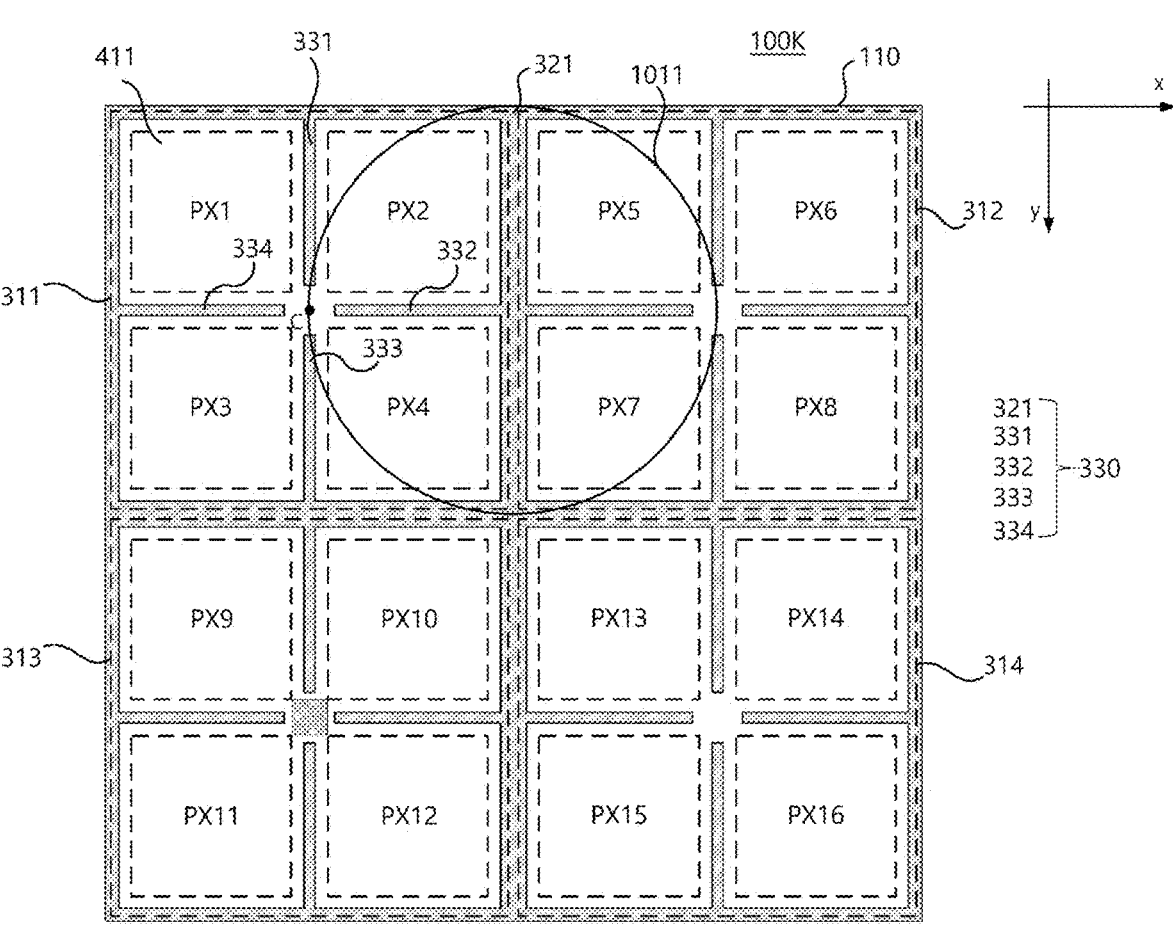

【FIG. 11】
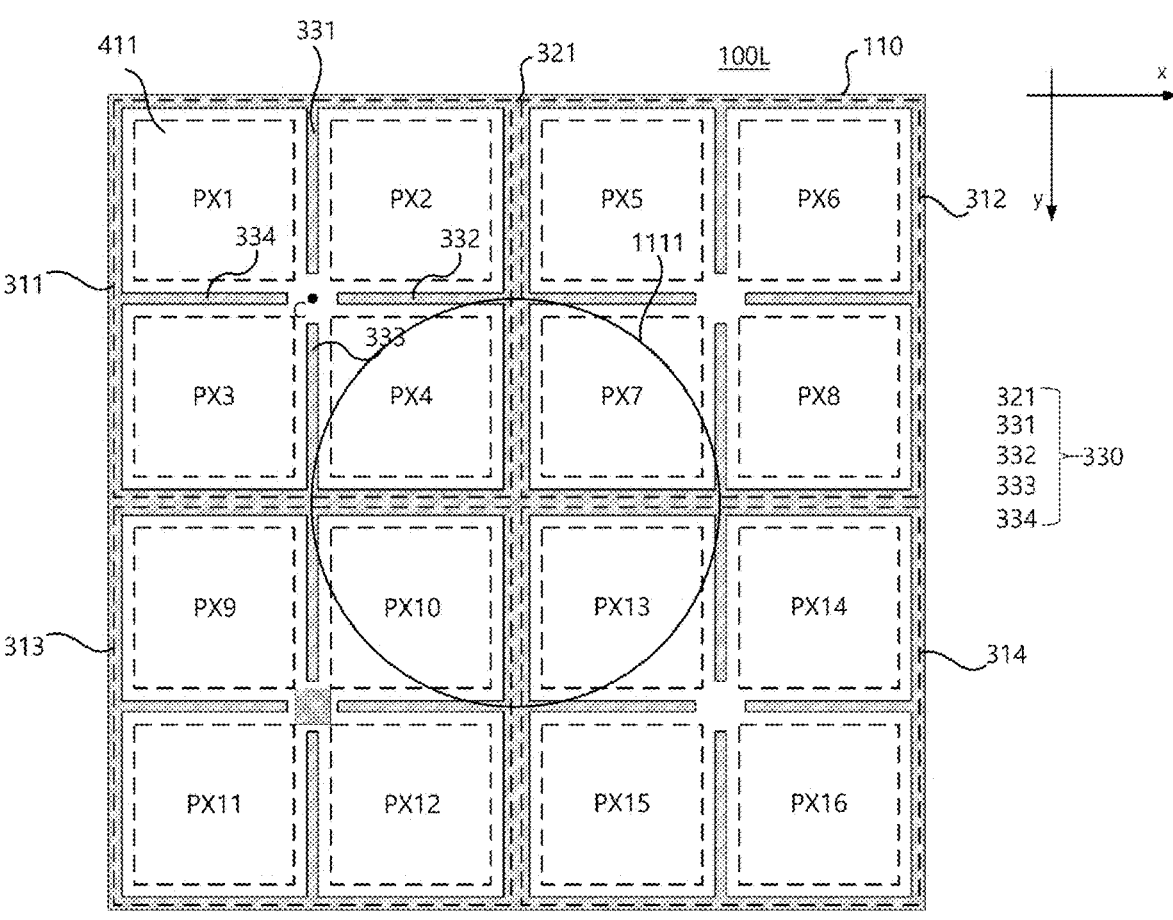

IMAGE SENSOR INCLUDING A PLURALITY OF PIXELS AND AT LEAST ONE LENS

CROSS-REFERENCE TO RELATED APPLICATION

This application claims priority to Korean Patent Application No. 10-2023-0101232, filed on Aug. 2, 2023, in the Korean Intellectual Property Office, the disclosure of which is incorporated herein by reference in its entirety.

BACKGROUND

One or more example embodiments relate to an image sensor including a plurality of pixels and at least one lens.

Semiconductor-based sensors may be configured as image sensors which generate electrical signals based on received light, and may include pixel arrays having a plurality of unit pixels, and circuits for driving the pixel arrays and generating images. The plurality of unit pixels may include photodiodes which generate charges in response to external light.

However, performance of an image sensor may be reduced due to signal interference between photodiodes of adjacent pixels. Deep trench isolation (DTI) may be formed between a plurality of photodiodes to prevent crosstalk.

Autofocusing (AF) has been actively used in the field of image sensors. Autofocusing is a function of automatically adjusting a lens to focus on a subject based on a phase difference between signals received from at least two pixels.

Recently, DTI is not formed in a portion between unit pixels, so that signal interference may occur between a photodiode, used for autofocusing, and adjacent diodes. As a result, performance of autofocusing of image sensors may be reduced. In addition, quality of images generated through the image sensor may be reduced.

SUMMARY

One or more example embodiments provide an image sensor, significantly reducing signal interference between a phase signal received for autofocusing and a color signal received for image generation.

According to an aspect of an example embodiment, an image sensor includes: a first pixel group including a first pixel, a second pixel, a third pixel and a fourth pixel arranged in a 2×2 matrix; a second pixel group including a fifth pixel, a sixth pixel, a seventh pixel and an eighth pixel arranged in a 2×2 matrix, wherein the second pixel group is provided adjacent to the first pixel in a first direction; a first lens corresponding to the first pixel and the second pixel; a second lens corresponding to the third pixel and the fourth pixel; a device isolation pattern electrically isolating the first pixel group from the second pixel group; and a readout circuit configured to: output phase data based on at least a portion of phase signals received from the first pixel group; and output image data based on at least a portion of color signals received from the second pixel group.

According to an aspect of an example embodiment, an image sensor includes: a first pixel group, a second pixel group, a third pixel group and a fourth pixel group provided in a 2×2 matrix, each including pixels arranged in a 2×2 matrix; a fifth pixel group including pixels arranged in a 2×2 matrix and provided adjacent to the fourth pixel group; and a readout circuit configured to: output phase data based on a first phase signal and a second phase signal, obtained from at least a portion of pixel signals of the first pixel group, in a first mode; and output the phase data based on a third phase signal, obtained from at least a portion of the pixel signals of the first pixel group, and a fourth phase signal, obtained from at least a portion of pixel signals of the fifth pixel group, in second mode.

According to an aspect of an example embodiment, an image sensor includes a first pixel group with a first pixel, a second pixel, a third pixel and a fourth pixel arranged in a 2×2 matrix; a second pixel group with a fifth pixel, a sixth pixel, a seventh pixel and an eighth pixel arranged in a 2×2 matrix, wherein the second pixel group is provided adjacent to the first pixel group; a first lens corresponding to at least two pixels, among pixels of the first pixel group and the second pixel group; a device isolation pattern electrically separating the pixels of the first pixel group and the second pixel group from each other; and a readout circuit electrically connected to a plurality of pixels. The device isolation pattern includes a plurality of portions electrically separating the first pixel, the second pixel, the third pixel, and the fourth pixel from each other. Each of the plurality of portions is spaced apart from a center of the first pixel group. The readout circuit is configured to: output phase data based on at least a portion of phase signals corresponding to the first lens; and output image data based on color signals received from pixels that are offset from the first lens, among the plurality of pixels.

BRIEF DESCRIPTION OF DRAWINGS

The above and other aspects, features, and advantages will be more apparent from the following description of example embodiments, taken in conjunction with the accompanying drawings.

FIG. 1 is a block diagram of an image sensor according to an example embodiment.

FIG. 2A is a diagram illustrating an example of a pixel array 110 of FIG. 1 according to an example embodiment.

FIG. 2B is a cross-sectional view taken along line A-A' of a portion of the pixel array of FIG. 2A according to an example embodiment.

FIG. 3 is a circuit diagram illustrating an example of a first pixel group of the pixel array of FIG. 2A according to an example embodiment.

FIG. 4A is a diagram illustrating a first lens and a second lens formed to correspond to pixels included in a first pixel group of the pixel array of FIG. 2, according to an example embodiment.

FIG. 4B is a diagram illustrating a first lens and a second lens formed to correspond to pixels included in a first pixel group of the pixel array of FIG. 2, according to another example embodiment.

FIG. 5 is a cross-sectional view taken along line B-B' of a portion of the pixel array of FIG. 4B according to an example embodiment.

FIG. 6A is a diagram illustrating first to fourth lenses formed to correspond to pixels included in a first pixel group and a fifth pixel group of a pixel array, according to an example embodiment.

FIG. 6B is a diagram illustrating first to fourth lenses formed to correspond to pixels included in a first pixel group and a fifth pixel group of a pixel array, according to an example embodiment.

FIG. 7A is a diagram illustrating a first lens formed to correspond to pixels included in a first pixel group of the pixel array of FIG. 2, according to an example embodiment.

FIG. 7B is a diagram illustrating a first lens formed to correspond to pixels included in a first pixel group of the pixel array of FIG. 2, according to an example embodiment.

FIG. 8A is a diagram illustrating a first lens formed to correspond to two pixels included in different pixel groups of the pixel array of FIG. 2, according to an example embodiment.

FIG. 8B is a diagram illustrating a first lens formed to correspond to two pixels included in different pixel groups of the pixel array of FIG. 2, according to an example embodiment.

FIG. 9A is a diagram illustrating a first lens and a second lens formed to correspond to two pixels included in different pixel groups of the pixel array of FIG. 2, according to an example embodiment.

FIG. 9B is a diagram illustrating a first lens and a second lens formed to correspond to two pixels included in different pixel groups of the pixel array of FIG. 2, according to an example embodiment.

FIG. 10 is a diagram illustrating a first lens formed to correspond to four pixels included in two different pixel groups of the pixel array of FIG. 2, according to an example embodiment.

FIG. 11 is a diagram illustrating a first lens formed to correspond to four pixels included in four different pixel groups of the pixel array of FIG. 2, according to an example embodiment.

DETAILED DESCRIPTION

Hereinafter, example embodiments will be described with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each example embodiment provided in the following description is not excluded from being associated with one or more features of another example or another embodiment also provided herein or not provided herein but consistent with the present disclosure.

FIG. 1 is a block diagram of an image sensor according to an example embodiment.

Referring to FIG. 1, an image sensor 100 may include a pixel array 110, a row driver 120, an analog-to-digital converter (ADC) 130, a readout circuit 140, a timing controller 150, and an image signal processor 160.

According to an example embodiment, the pixel array 110 may include a plurality of unit pixels 112. In addition, the pixel array 110 may include a plurality of pixel groups, each of which includes a set of the plurality of unit pixels 112. For example, each of the pixel groups may include at least two unit pixels 112 sharing the same microlens ML.

The pixel array 110 may receive pixel driving signals, such as a reset signal RS, a transmit signal TS, and a select signal SEL, from the row driver 120. The pixel array 110 may operate under the control of received pixel driving signals, and each of the plurality of unit pixels 112 may convert an optical signal into an analog signal. An analog signal generated by each of the unit pixels 112 may be provided to the analog-to-digital converter 130 through a plurality of column lines CLm. In this case, the analog signal generated by each of the unit pixels 112 may indicate image information and phase information.

In an example embodiment, at least a portion of the plurality of unit pixels 112 may include a shared pixel structure in which multiple photodiodes PD share a single floating diffusion node FD. However, this is only an example, and each of the plurality of unit pixels 112 may include different floating diffusion nodes FD.

The row driver 120 may select a single row of the pixel array 110 under the control of the timing controller 150. The row driver 120 may generate a select signal SEL to select a single row, among a plurality of rows. In addition, the row driver 120 may enable the reset signal RS and the transmit signal TS for pixels corresponding to the selected row in a predetermined order.

The analog-to-digital converter 130 may receive a reset level signal and a sensing signal generated from each of a selected row of pixels. The reset level signal may be an analog signal corresponding to a reference voltage at a floating diffusion node, and the sensing signal may be an analog signal corresponding to a signal voltage at the floating diffusion node.

The analog-digital converter 130 may convert the reset level signal and the sensing signal into digital signals, and may then output the digital signals. For example, the analog-to-digital converter 130 may sample the reset level signal and the sensing signal in a correlated double sampling scheme, and may then convert the sampled signals into digital signals. To this end, a correlated double sampler (CDS) may be further provided in front of the analog-to-digital converter 130.

The readout circuit 140 may latch and output a column-based digital signal provided by the analog-to-digital converter 130. To this end, the readout circuit 140 may include an output buffer.

In addition, the readout circuit 140 may include an image data generator 141 and a phase data generator 142.

According to an example embodiment, the image data generator 141 may generate image data IDAT based on digital signals received from a plurality of pixels included in the pixel array 110.

For example, the image data generator 141 may generate image data IDAT by synthesizing digital signals received from a plurality of pixels included in the pixel array 110.

For example, the image data generator 141 may receive a first digital signal, corresponding to a pixel disposed on the left side in a single pixel group, and a second digital signal corresponding to a pixel disposed on the right side in the single pixel group. The first digital signal and the second digital signal may each include image information and phase information.

The image data generator 141 may generate image data IDAT by combining a first digital signal and a second digital signal. In this case, phase information of the first digital signal DS1 and phase information of the second digital signal DS2 may cancel each other out.

According to an example embodiment, the phase data generator 142 may receive digital signals corresponding to at least two pixels included in each of a plurality of pixel groups.

For example, the phase data generator 142 may receive digital signals corresponding to at least two pixels sharing a microlens, among pixels included in each of a plurality of pixel groups.

For example, the phase data generator 142 may receive digital signals corresponding to pixels disposed on the left side, among at least two pixels of a pixel group, and may bin the received digital signals to extract first phase information. In this case, the digital signals corresponding to the pixels located on the left side, among the at least two pixels, may be referred to as "first phase signals."

In addition, the phase data generator 142 may receive digital signals corresponding to pixels disposed on the right side, among the at least two pixels of the pixel group, and may bin the received digital signals to extract second phase information. In this case, the digital signals corresponding to the pixels disposed on the right side, among the at least two pixels, may be referred to as "second phase signals."

The phase data generator 142 may generate phase data PDAT based on first phase information and second phase information. For example, the phase data generator 142 may generate phase data PDAT by comparing the first phase signal and the second phase signal.

The timing controller 150 may control at least a portion of the pixel array 110, the row driver 120, the analog-to-digital converter (ADC) 130, and the readout circuit 140.

For example, the timing controller 150 may provide control signals, such as a clock signal and a timing control signal, to the operations of the pixel array 110, the row driver 120, the analog-to-digital converter (ADC) 130, and the readout circuit 140.

The timing controller 150 may include a logic control circuit, a phase lock loop (PLL) circuit, a timing control circuit, and a communication interface circuit.

According to an example embodiment, the image sensor 100 may include an image signal processor (ISP) 160 connected to the readout circuit 140. According to an example embodiment, the image signal processor 160 may be implemented as a chip, separate from the image sensor 100.

The image signal processor 160 may process the phase data PDAT and image data IDAT provided from the readout circuit 140.

For example, the image signal processor 160 may perform autofocusing (AF) to measure the focus on a subject based on the phase data PDAT received from the readout circuit 140.

In addition, the image signal processor 160 may generate an image for the subject based on the image data IDAT received from the readout circuit 140.

FIG. 2A is a diagram illustrating an example of the pixel array 110 of FIG. 1, and FIG. 2B is a cross-sectional view taken along line A-A' of a portion of the pixel array of FIG. 2A. FIG. 3 is a circuit diagram illustrating an example of a first pixel group of the pixel array of FIG. 2A.

Referring to FIGS. 2A and 2B together, the pixel array 110 according to an example embodiment may include a plurality of pixels PX1 to PX16 and a device isolation pattern 330 electrically separating the plurality of pixels. In this case, the plurality of pixels PX1 to PX16 may be understood to correspond to the unit pixels 112 of FIG. 1.

Referring to FIG. 2A, the pixel array 110 may include a first pixel group 311, a second pixel group 312, a third pixel group 313, and a fourth pixel group 314, each including pixels arranged in a 2×2 matrix.

For example, the pixel array 110 may include a first pixel group 311 including first pixels PX1 to fourth pixels PX4 arranged in a 2×2 matrix. In addition, the pixel array 110 may include a second pixel group 312 including fifth to eighth pixels PX5 to PX8 arranged in a 2×2 matrix. In addition, the pixel array 110 may include a third pixel group 313 including ninth to twelfth pixels PX9 to PX12 arranged in a 2×2 matrix. In addition, the pixel array 110 may include a fourth pixel group 314 including thirteenth pixels PX13 to sixteenth pixels PX16 arranged in a 2×2 matrix.

The first to fourth pixel groups 311 to 314 may be arranged in a 2×2 matrix to form the pixel array 110. Accordingly, for example, the pixel array 110 may include 16 pixels arranged in a 4×4 matrix, but example embodiments are not limited thereto.

Referring to FIGS. 1 and 2A together, the image sensor 100 according to an example embodiment may include a plurality of microlenses formed to correspond to at least one of the plurality of pixels PX1 to PX16. For example, the image sensor 100 may include a first microlens formed to correspond to the first pixel PX1 and the second pixel PX2, and a second microlens formed to correspond to the fifth pixel PX5. However, the configuration of microlenses formed to correspond to at least one pixel is not limited to the above-described example.

The pixel array 110 may include a device isolation pattern 330, electrically separating a plurality of pixels.

For example, the device isolation pattern 330 may include a first isolation pattern 321, electrically separating the first to fourth pixel groups 311 to 314.

According to an example embodiment, the device isolation pattern 330 may include a plurality of portions 331, 332, 333, and 334 extending from the first isolation pattern 321 to electrically separate a plurality of pixels. The device isolation pattern 330 may be formed between pixels included in the first pixel group 311, and may include a plurality of portions 331, 332, 333, and 334, electrically separating the first to fourth pixels PX1 to PX4.

In this case, the plurality of portions 331, 332, 333, and 334 may include a first portion 331 extending from the first isolation pattern 321 in a second direction (for example, a positive y-direction) between the first pixel PX1 and the second pixel PX2. The first pixel PX1 and the second pixel PX2 may be electrically separated from each other by the first portion 331.

In addition, the plurality of portions 331, 332, 333, and 334 may include a second portion 332 extending from the first isolation pattern 321 in a direction opposite to the first direction (for example, a negative x-direction) between the second pixel PX2 and the fourth pixel PX4. The second pixel PX2 and the fourth pixel PX4 may be electrically separated from each other by the second portion 332.

In addition, the plurality of portions 331, 332, 333, and 334 may include a third portion 333 extending from the first isolation pattern 321 in a direction opposite to the second direction (for example, a negative y-direction) between the third pixel PX3 and the fourth pixel PX4. The third pixel PX3 and the fourth pixel PX4 may be electrically separated from each other by the third portion 333.

In addition, the plurality of portions 331, 332, 333, and 334 may include a fourth portion 334 extending from the first isolation pattern 321 in a first direction (for example, a positive x-direction) between the third pixel PX3 and the first pixel PX1. The third pixel PX3 and the first pixel PX1 may be electrically separated from each other by the fourth portion 334.

According to an example embodiment, each of the first portion 331, the second portion 332, the third portion 333, and the fourth portion 334 may be formed to be spaced apart from the center C of the first pixel group 311.

For example, each of the first portion 331, the second portion 332, the third portion 333, and the fourth portion 334 may be formed to have one end connected to the first separation pattern 321, and another end spaced apart from the center C of the first pixel group 311.

For example, each of the plurality of portions 331, 332, 333, and 334 may be formed to be spaced apart from the first separation pattern 321 and the center C of the first pixel group 311.

In this case, the device isolation pattern 330 may be formed through, for example, a deep trench isolation (DTI) process, but example embodiments are not limited thereto. Alternatively, the device isolation pattern 330 may be formed through, for example, a shallow trench isolation (STI) process.

In addition, the device isolation pattern 330 may be formed of, for example, an oxide and/or polysilicon.

The pixel array 110 may include floating diffusion nodes FD1, FD2, FD3, and FD4 electrically connected to a plurality of pixels.

For example, the pixel array 110 may include a first floating diffusion node FD1 to a fourth floating diffusion node FD4 electrically connected to pixels included in each of the pixel groups 311, 312, 313, and 314.

For example, the pixel array 110 may include a first floating diffusion node FD1 electrically connected to a first pixel PX1 to a fourth pixel PX4 included in the first pixel group 311. In addition, the pixel array 110 may include a second floating diffusion node FD2 electrically connected to a fifth pixel PX5 to an eighth pixel PX8 included in the second pixel group 312. In addition, the pixel array 110 may include a third floating diffusion node FD3 electrically connected to a ninth pixel PX9 to a twelfth pixel PX12 included in the third pixel group 313. In addition, the pixel array 110 may include a fourth floating diffusion node FD4 electrically connected to a thirteenth pixel PX13 to a sixteenth pixel PX16 included in the fourth pixel group 314.

According to an example embodiment, the first to fourth floating diffusion nodes FD1 to FD4 may be formed in locations corresponding to a center of each pixel group. For example, the first floating diffusion node FD1 may be formed in a location corresponding to the center C of the first pixel group 311. However, a location in which a floating diffusion node is formed is not limited to the above-described example, and the floating diffusion node may be formed in various locations to be electrically connected to a plurality of pixels.

According to an example embodiment, the first portion 331, the second portion 332, the third portion 333, and the fourth portion 334 may be formed to be spaced apart from the first floating diffusion node FD1 to the fourth floating diffusion node FD4, respectively.

In addition, the device isolation pattern 330 may further include a plurality of portions formed to respectively extend inwardly of the second pixel group 312, the third pixel group 313, and the fourth pixel group 314 and to be isolated from the center of each of the pixel groups 312, 313, and 314.

In this case, a plurality of portions extending toward the center of each of the pixel groups 312, 313, and 314 may also be formed to be spaced apart from the second floating diffusion node FD2 to the fourth floating diffusion node FD4, respectively.

Thus, the pixel array 110 according to example embodiments may reduce an area for forming a floating diffusion node for each of the plurality of pixels. In addition, the pixel array 110 may reduce interconnections and structures for connecting the plurality of pixels and the floating diffusion node.

Referring to FIG. 2B, the pixel array 110 according to an example embodiment may include a substrate 210, a color filter 230, a light transmission layer 220, and an insulating layer 270. In this case, the substrate 210 may include photodiodes PD1 and PD4, respectively corresponding to the plurality of pixels PX1 and PX4.

According to an example embodiment, the color filter 230 and the light transmission layer 220 may be sequentially disposed on a surface of the substrate 210. For example, the color filter 230 may be a green color filter in a region corresponding to the first pixel group 311, but example embodiments are not limited thereto.

The photodiodes PD1 and PD4 may obtain light that has passed through the microlens, the light transmission layer 220, and the color filter 230.

An insulating layer 270 may be disposed below the photodiodes PD1 and PD4 or the substrate 210. For example, the insulating layer 270 may include a plurality of elements 260 and interconnection patterns 280 connected to the plurality of elements 260. The plurality of elements 260 and the interconnection patterns 280, included in the insulating layer 270, may operate to obtain pixel signals from the plurality of pixels PX1 and PX4.

According to an example embodiment, the first photodiode PD1 corresponding to the first pixel PX1 and the fourth photodiode PD4 corresponding to the fourth pixel PX4 may share the first floating diffusion node FD1.

Each of the plurality of elements 260 adjacent to the first floating diffusion node FD1 may be referred to as a transfer transistor. In this case, a gate of the transfer transistor may have a vertical structure in which at least a portion is buried in the substrate 210.

The plurality of pixels PX1, PX2, PX3, and PX4 included in the first pixel group 311 may be electrically separated from the plurality of pixels PX5, PX6, PX7, and PX8, included in the second pixel group 312, by the first separation pattern 321. The device isolation pattern 330 (or the first isolation pattern 321) may be separated to the extent that charge overflow does not occur between adjacent photodiodes.

Referring to FIGS. 2A, 2B, and 3 together, according to an example embodiment, the first pixel group 311 may include the first pixel PX1 to the fourth pixel PX4 sharing the first floating diffusion node FD1. In this case, the first pixel PX1 and the third pixel PX3 are disposed on the left side L from the center C, and the second pixel PX2 and the fourth pixel PX4 may be disposed on the right side R from the center C.

Charges, generated through each of the first to fourth photodiodes PD1 to PD4, may be transferred to the first floating diffusion node FD1 through the first transfer transistor TX1 to the fourth transfer transistor TX4.

In this case, the charges generated through each of the first to fourth photodiodes PD1 to PD4 may be sequentially transferred to the first floating diffusion node FD1 by transfer signals TS1, TS2, TS3, and TS4 transmitted from the timing controller 150 to the first to fourth transfer transistors TX1 to TX4.

For example, the charges generated through the first photodiode PD1 may be transferred to the first floating diffusion node FD1 according to the first transfer signal TS1 transmitted to the first transfer transistor TX1.

In addition, the charges accumulated in the first floating diffusion node FD1 may be transferred to the driving transistor DX and then be output as an output voltage Vout through a select transistor SX.

The charges stored in the first floating diffusion node FD1 may be reset in response to a reset signal RS transmitted from the timing controller 150 to the reset transistor RX.

The charges generated through the second photodiode PD2 may be transferred to the first floating diffusion node FD1 according to a second transfer signal TS2 transmitted to the second transfer transistor TX2.

Thus, the image sensor 100 according to example embodiments may reduce costs and a region consumed to implement a floating diffusion node for each unit pixel 112.

Moreover, the image sensor 100 according to example embodiments may improve resolution of the image data IDAT generated by the readout circuit 140.

FIG. 4A is a diagram illustrating a first lens and a second lens formed to correspond to pixels included in a first pixel group of the pixel array of FIG. 2, according to an example embodiment. FIG. 4B is a diagram illustrating a first lens and a second lens formed to correspond to pixels included in the first pixel group of the pixel array of FIG. 2 according to another example embodiment. FIG. 5 is a cross-sectional view taken along line B-B' of a portion of the pixel array of FIG. 4B.

Referring to FIGS. 4A and 4B, the image sensors 100A and 100B according to an example embodiment may include lenses formed to correspond to two adjacent pixels, among a plurality of pixels included in the pixel array 110.

For example, each of the image sensors 100A and 100B may include lenses formed to correspond to two adjacent pixels, among a plurality of pixels included in the first pixel group 311.

Referring to FIG. 4A, the image sensor 100A may include a first lens 411A and a second lens 412A formed to correspond to two pixels adjacent to each other in a first direction (for example, an x-direction), among the pixels included in the first pixel group 311.

For example, the image sensor 100A may include a first lens 411A, formed to correspond to the first pixel PX1 and the second pixel PX2 of the first pixel group 311, and a second lens 412A formed to correspond to the third pixel PX3 and the fourth pixel PX4 of the first pixel group 311.

Referring to FIG. 4B, the image sensor 100B may include a first lens 411B and a second lens 412B formed to correspond to two pixels adjacent to each other in a second direction (for example, a y-direction), among a plurality of pixels included in the first pixel group 311.

For example, the image sensor 100B may include a first lens 411B, formed to correspond to the first pixel PX1 and the third pixel PX3 of the first pixel group 311, and a second lens 412B formed to correspond to the second pixel PX2 and the fourth pixel PX4 of the first pixel group 311.

The image sensors 100A and 100B may include a plurality of microlenses formed to correspond to each of the pixels except for the first pixel PX1 to the fourth pixel PX4, among a plurality of pixels. For example, a corresponding microlens may be provided for each of the plurality of pixels, except for the first pixel PX1 to the fourth pixel PX4. For example, a microlens may be provided for the fifth pixel PX5, another microlens may be provided for the sixth pixel PX6, still another microlens may be provided for the seventh pixel PX7, and yet another microlens may be provided for the eighth pixel PX8.

Referring to FIGS. 1 and 4A together, the readout circuit 140 according to an example embodiment may obtain phase signals through pixels included in the first lens 411A, the second lens 412A, and the first pixel group 311.

For example, the readout circuit 140 may obtain a first phase signal through the first lens 411A and the first pixel PX1 or the second pixel PX2. For example, the readout circuit 140 may obtain the first phase signal through the first lens 411A and the first pixel PX1.

In addition, the readout circuit 140 may obtain a second phase signal through the second lens 412A and the third pixel PX3 or the fourth pixel PX4. For example, the readout circuit 140 may obtain a second phase signal through the second lens 412A and the fourth pixel PX4.

Referring to FIGS. 1 and 4B together according to an example embodiment, the readout circuit 140 may obtain a first phase signal through the first lens 411B and the first pixel PX1 and/or the third pixel PX3. In addition, the readout circuit 140 may obtain a second phase signal through the second lens 412B and the second pixel PX2 and/or the fourth pixel PX4.

For example, the readout circuit 140 may obtain the first phase signal through the first lens 411B and the third pixel PX3. Additionally, the readout circuit 140 may obtain a second phase signal through the second lens 412B and the fourth pixel PX4.

Moreover, the readout circuit 140 may output phase data PDAT based on the first phase signal and the second phase signal.

For example, the phase data generator 142 may compare the first phase signal and the second phase signal. The phase data generator 142 may generate phase data PDAT, including a focal length to a subject, based on a result of the comparison. Furthermore, the readout circuit 140 may output the generated phase data PDAT.

Referring to the above-described components, the readout circuit 140 may obtain the first phase signal through the first lenses 411A and 411B and the second phase signal through the second lenses 412A and 412B. In this case, the first lenses 411A and 411B and the second lenses 412A and 412B may each be formed to correspond to two adjacent pixels, among a plurality of pixels arranged in a 2×2 matrix.

Thus, the image sensors 100A and 100B according to example embodiments may significantly reduce signal interference between phase signals generated through the first floating diffusion node FD1 within the first pixel group 311.

The readout circuit 140 according to an example embodiment may operate in first or second mode based on the intensity of light received through the pixel array 110.

For example, the readout circuit 140 may operate in the first mode when the intensity of light received through the pixel array 110 is greater than a predetermined reference value. The readout circuit 140 may operate in the second mode when the intensity of light received through the pixel array 110 is less than the predetermined reference value.

For example, the readout circuit 140 may operate in a first mode in a high-light environment and operate in a second mode in a low-light environment.

The readout circuit 1400 may receive first color signals, respectively assigned to pixels, from the fifth to sixteenth pixels PX5 to PX16, among the plurality of pixels PX1 to PX16, in the first mode. For example, the readout circuit 140 may obtain a red color signal through the fifth pixel PX5, and may obtain a green color signal through the thirteenth pixel PX13.

Furthermore, the readout circuit 140 may output image data IDAT, based on the first color signals, through the image data generator 141 in the first mode. For example, the image data generator 141 may generate image data IDAT by synthesizing the first color signals, respectively received from the fifth to sixteenth pixels PX5 to PX16. The readout circuit 140 may output the generated image data IDAT.

The readout circuit 1400 may obtain second color signals, respectively assigned to pixel groups, from the second pixel group 312, the third pixel group 313, and the fourth pixel group 314 in the second mode. For example, the readout circuit 140 may obtain a red color signal through pixels included in the second pixel group 312, and may obtain a blue color signal through pixels included in the third pixel group 313.

Furthermore, the readout circuit 140 may output image data IDAT, based on the second color signals, through the image data generator 141 in the second mode. For example, the image data generator 141 may generate image data IDAT by synthesizing the second color signals, respectively received from the second to fourth pixel groups 312 to 314. The readout circuit 140 may output the generated image data IDAT.

Referring to the above-described components, the readout circuit 140 may receive color signals in different modes based on the intensity of light received through the pixel array 110. For example, the image sensors 100A and 100B may generate image data IDAT using color signals received in different modes depending on a change in light environment.

Thus, the image sensors 100A and 100B according to example embodiments may increase image quality and/or resolution of the generated image data IDAT.

Referring to FIGS. 4B and 5 together, photodiodes according to an example embodiment may be electrically separated from each other by the device isolation pattern 330.

However, at least a portion of the components illustrated in FIG. 5 (for example, the light transmission layer 220, the insulating layer 270, or the like) may be understood as being substantially the same as the components illustrated in FIG. 2B. The same reference numerals are used for the same or substantially the same components as described above, and redundant descriptions are omitted.

For example, the first pixel PX1 and the second pixel PX2, included in the first pixel group 311, may be electrically separated from the fifth pixel PX5 and the sixth pixel PX6, included in the second pixel group 312, by the device isolation pattern 330 (or the first isolation pattern 321).

In this case, the first photodiode PD1 and the second photodiode PD2 may respectively correspond to the first pixel PX1 and the second pixel PX2, and the fifth photodiode PD5 and the sixth photodiode PD6 may respectively correspond to the fifth pixel PX5 and the sixth pixel PX6.

Accordingly, the first photodiode PD1 and the second photodiode PD2 may be electrically separated from the fifth photodiode PD5 and the sixth photodiode PD6 by the device isolation pattern 330 (or the first isolation pattern 321).

The readout circuit 140 may receive a phase signal through at least a portion of the first lens 411B, the second lens 412B, the first photodiode PD1, and the second photodiode PD2.

In addition, first microlens 511 may be provided on the fifth pixel PX5 and second microlens 512 may be provided on the sixth pixel PX6. The readout circuit 140 may receive a color signal through at least a portion of the first microlens 511, the second microlens 512, the fifth photodiode PD5, and the sixth photodiode PD6.

In this case, signal interference between the phase signal and the color signal may be significantly reduced by the device isolation pattern 330 (or the first isolation pattern 321).

For example, signal interference between the phase signals, received through the second lens 412B and the second photodiode PD2, and the color signals, received through the first microlens 511 and the fifth photodiode PD5, may be reduced through the first isolation pattern 321.

Referring to the above-described components, the image sensors 100A and 100B according to an example embodiment may significantly reduce signal interference between the phase signal and the color signal received through the pixel array 110.

Thus, the image sensors 100A and 100B may improve signal quality of phase data PDAT and image data IDAT.

Moreover, the image sensor 100 may improve performance of autofocusing (AF) based on the phase data PDAT. In addition, the image sensors 100A and 100B may improve quality of images generated from the image data IDAT.

FIG. 6A is a diagram illustrating first to fourth lenses formed to correspond to pixels included in a first pixel group and a fifth pixel group of a pixel array, according to an example embodiment. FIG. 6B is a diagram illustrating first to fourth lenses formed to correspond to pixels included in a first pixel group and a fifth pixel group of a pixel array, according to an example embodiment.

Referring to FIGS. 6A and 6B together, the pixel array 110 according to an example embodiment may include a first pixel group 311 to an eighth pixel group 318, each including pixels arranged in a 2×2 matrix.

However, the first pixel group 311 to the fourth pixel group 314 illustrated in FIGS. 6A and 6B may be understood to correspond to the first pixel group 311 to the fourth pixel group 314 illustrated in FIG. 2A. Accordingly, the same reference numerals are used for the same or substantially the same components as described above, and redundant descriptions are omitted.

In addition, each of the image sensors 100C and 100D may include four lenses formed to correspond to two adjacent pixels, among the plurality of pixels included in the pixel array 110, and individual lenses formed to correspond to individual pixels, other than the eight pixels corresponding to the four lenses.

For example, the image sensors 100C and 100D may include first lenses 611A and 611B and second lenses 612A and 612B, respectively formed to correspond to two adjacent pixels among the plurality of pixels included in the first pixel group 311. In addition, the image sensors 100C and 100D may include third lenses 613A and 613B and fourth lenses 614A and 614B, respectively formed to correspond to two pixels among the plurality of pixels included in the fifth pixel group 315.

Referring to FIG. 6A, the image sensor 100C may include a first lens 611A and a second lens 612A formed to correspond to two pixels adjacent to each other in a first direction (for example, an x-direction), among a plurality of pixels included in the first pixel group 311. In addition, the image sensor 100C may include a third lens 613A and a fourth lens 614A formed to correspond to two pixels adjacent to each other in the first direction (for example, the x-direction) among the plurality of pixels included in the fifth pixel group 315.

According to an example embodiment, the readout circuit 140 may obtain a first phase signal through at least a portion of the first lens 611A, the first pixel PX1, and the second pixel PX2 in first mode. For example, the readout circuit 140 may obtain the first phase signal through the first lens 611A and the first pixel PX1 in the first mode.

In addition, the readout circuit 140 may obtain a second phase signal through at least a portion of the second lens 612A, the third pixel PX3, and the fourth pixel PX4 in the first mode. For example, the readout circuit 140 may obtain the second phase signal through the second lens 612A and the fourth pixel PX4 in the first mode.

Referring to FIG. 6B according to an example embodiment, the image sensor 100D may include a first lens 611B and a second lens 612B formed to correspond to two pixels adjacent to each other in a second direction (for example, a y-direction), among the plurality of pixels included in the first pixel group 311. In addition, the image sensor 100D may include a third lens 613B and a fourth lens 614B formed to correspond to two pixels adjacent to each other in the second direction (for example, the y-direction) among the plurality of pixels included in the fifth pixel group 315.

The readout circuit 140 may obtain a first phase signal through the first lens 611B and the first pixel PX1 and/or the third pixel PX3 in the first mode. In addition, the readout circuit 140 may obtain the second phase signal through the second lens 612B and the second pixel PX2 and/or the fourth pixel PX4 in the first mode.

Moreover, the readout circuit 140 may output phase data PDAT based on the first phase signal and the second phase signal in the first mode. For example, the readout circuit 140 may compare the first phase signal and the second phase signal using the phase data generator 142 in the first mode. The readout circuit 140 may output (or generate) the phase data PDAT, including a focal length to a subject, based on a result of the comparison.

According to an example embodiment, the readout circuit 140 may obtain a third phase signal through at least a portion of pixels, included in the first pixel group 311, in the second mode.

For example, referring to FIG. 6A, the readout circuit 140 may obtain a third phase signal through the first lens 611A, the first pixel PX1, and the second pixel PX2 in the second mode. For example, referring to FIG. 6B, the readout circuit 140 may obtain a third phase signal through the second lens 612B, the second pixel PX2, and the fourth pixel PX4 in the second mode.

In addition, the readout circuit 140 may obtain a fourth phase signal through at least a portion of pixels included in the fifth pixel group 315 in the second mode.

For example, referring to FIG. 6A, the readout circuit 140 may obtain a fourth phase signal through a third lens 613A, a seventeenth pixel PX17, and an eighteenth pixel PX18 in the second mode. For example, referring to FIG. 6B, the readout circuit 140 may obtain a fourth phase signal through a fourth lens 614B, an eighteenth pixel PX18, and a twentieth pixel PX20 in the second mode.

Moreover, the readout circuit 140 may output phase data PDAT based on the third phase signal and the fourth phase signal in the second mode. For example, the readout circuit 140 may compare the third phase signal and the fourth phase signal using the phase data generator 142 in the second mode. The readout circuit 140 may output (or generate) phase data PDAT, including a focal length to a subject, based on a result of the comparison.

Referring to the above-described configurations, when the intensity of light received through the pixel array 110 is less than a reference value, the readout circuit 140 may obtain the third phase signal and the fourth phase signal through lenses formed to correspond to a portion of pixels included in pixel groups spaced apart from each other.

Furthermore, the readout circuit 140 may output phase data PDAT based on the third phase signal and the fourth phase signal. The image sensors 100C and 100D (or the image signal processor 160) may perform autofocusing to measure a focal length on a subject based on the phase data PDAT.

Thus, the image sensors 100C and 100D according to example embodiments may improve performance of the autofocusing based on the phase data PDAT even when the intensity of light received through the pixel array 110 is less than the reference value.

FIG. 7A is a diagram illustrating a first lens formed to correspond to pixels included in a first pixel group of the pixel array of FIG. 2, according to an example embodiment. FIG. 7B is a diagram illustrating a first lens formed to correspond to pixels included in a first pixel group of the pixel array of FIG. 2, according to an example embodiment.

Referring to FIGS. 7A and 7B together, image sensors 100E and 100F according to an example embodiment may respectively include first lenses 711A and 711B formed to correspond to pixels included in a first pixel group 311 of a pixel array 110.

For example, the image sensors 100E and 100F may respectively include the first lenses 711A and 711B formed to correspond to two adjacent pixels, among the pixels included in the first pixel group 311.

Referring to FIG. 7A, the image sensor 100E according to an example embodiment may include the first lens 711A formed to correspond to a third pixel PX3 and a fourth pixel PX4 adjacent to the third pixel PX3 in a first direction (for example, an x-direction).

Referring to FIG. 7B, the image sensor 100F according to an example embodiment may include the first lens 711B formed to correspond to a first pixel PX1 in the first pixel group 311 and a third pixel PX3 adjacent to the first pixel PX1 in a second direction (for example, a y-direction).

According to an example embodiment, the readout circuit 140 may obtain a first phase signal and a second phase signal from two pixels corresponding to the same lens.

For example, referring to FIG. 7A, the readout circuit 140 may obtain the first phase signal through the first lens 711A and the third pixel PX3, and may obtain the second phase signal through the first lens 711A and the fourth pixel PX4.

For example, referring to FIG. 7B, the readout circuit 140 may obtain the first phase signal through the first lens 711B and the first pixel PX1, and may obtain the second phase signal through the first lens 711B and the third pixel PX3.

The readout circuit 140 may output phase data PDAT through the phase data generator 142 based on the first phase signal and the second phase signal.

For example, the phase data generator 142 may generate phase data PDAT by comparing the first phase signal and the second phase signal. The readout circuit 140 may output the generated phase data PDAT. In this case, the phase data PDAT may include information related to a focus on the subject.

The image signal processor 160 may perform autofocusing based on the phase data PDAT received from the readout circuit 140.

In addition, the readout circuit 140 may obtain color signals from pixels of the pixel array 110, other than pixels corresponding to the first lenses 711A and 711B. For example, the readout circuit 140 may obtain color signals from pixels of the pixel array 110, other than the third pixel PX3 and the fourth pixel PX4. For example, the readout circuit 140 may obtain color signals from pixels of the pixel array 110, other than the first pixel PX1 and the third pixel PX3.

Moreover, the readout circuit 140 may output the image data IDAT through the image data generator 141 based on the color signals.

For example, the image data generator 141 may generate image data IDAT by synthesizing the received color signals. The readout circuit 140 may output the generated image data IDAT.

Thus, the image sensors 100E and 100F according to example embodiments may perform autofocusing on the subject based on the signal received through the pixel array 110. In addition, the image sensors 100E and 100F may generate an image for the subject.

As a result, the image sensors 100E and 100F may improve performance of the autofocusing for the subject. In addition, the image sensors 100E and 100F may improve quality and/or resolution of a generated image.

FIG. 8A is a diagram illustrating a first lens formed to correspond to two pixels included in different pixel groups of the pixel array of FIG. 2, according to an example embodiment. FIG. 8B is a diagram illustrating a first lens formed to correspond to two pixels included in different pixel groups of the pixel array of FIG. 2, according to an example embodiment.

Referring to FIGS. 8A and 8B together, image sensors 100G and 100H according to an example embodiment may respectively include first lenses 811A and 811B formed to correspond to two pixels included in different pixel groups of the pixel array 110.

Referring to FIG. 8A, the image sensor 100G according to an example embodiment may include the first lens 811A formed to correspond to a fourth pixel PX4 of a first pixel group 311 and a seventh pixel PX7 of a second pixel group 312. For example, the fourth pixel PX4 and the seventh pixel PX7 may be disposed adjacent to each other in a first direction (for example, an x-direction).

Referring to FIG. 8B, the image sensor 100H according to an example embodiment may include the first lens 811B formed to correspond to a seventh pixel PX7 of the second pixel group 312 and a thirteenth pixel PX13 of the fourth pixel group 314. For example, the seventh pixel PX7 and the thirteenth pixel PX13 may be disposed adjacent to each other in a second direction (for example, a y-direction).

According to an example embodiment, the readout circuit 140 may obtain a first phase signal and a second phase signal from two pixels corresponding to the same lens.

For example, referring to FIG. 8A, the readout circuit 140 may obtain the first phase signal through the first lens 811A and the fourth pixel PX4, and may obtain the second phase signal through the first lens 811A and the seventh pixel PX7.

For another example, referring to FIG. 8B, the readout circuit 140 may obtain the first phase signal through the first lens 811B and the seventh pixel PX7, and may obtain the second phase signal through the first lens 811B and the thirteenth pixel PX13.

The phase data generator 142 may generate phase data PDAT based on the first phase signal and the second phase signal.

For example, the phase data generator 142 may generate phase data PDAT by comparing the first phase signal and the second phase signal. The readout circuit 140 may output the generated phase data PDAT. In this case, the phase data PDAT may include information related to a focus on the subject.

The image signal processor 160 may perform autofocusing based on the phase data PDAT received from the readout circuit 140.

In addition, the readout circuit 140 may obtain color signals from pixels of the pixel array 110, other than pixels corresponding to the first lenses 811A and 811B.

For example, the readout circuit 140 may obtain color signals from pixels other than the fourth pixel PX4 and the seventh pixel PX7 of the pixel array 110. For example, the readout circuit 140 may obtain color signals from pixels of the pixel array 110, other than the seventh pixel PX7 and the thirteenth pixel PX13 of the pixel array 110.

Moreover, the readout circuit 140 may output image data IDAT through the image data generator 141 based on color signals.

For example, the image data generator 141 may generate image data IDAT by synthesizing the received color signals. The readout circuit 140 may output the generated image data IDAT.

Thus, the image sensors 100G and 100H according to example embodiments may perform autofocusing on the subject based on the signal received through the pixel array 110. In addition, the image sensors 100G and 100H may generate an image for the subject.

As a result, the image sensors 100G and 100H may improve performance of the autofocusing for the subject. In addition, the image sensors 100G and 100H may improve image quality and/or resolution of a generated image.

FIG. 9A is a diagram illustrating a first lens and a second lens formed to correspond to two pixels included in different pixel groups of the pixel array of FIG. 2, according to an example embodiment. FIG. 9B is a diagram illustrating a first lens and a second lens formed to correspond to two pixels included in different pixel groups of the pixel array of FIG. 2, according to an example embodiment.

Referring to FIGS. 9A and 9B together, image sensors 100I and 100J according to an example embodiment may each include a first lens 911A and 911B and a second lens 912A and 912B formed to correspond to two pixels included in different pixel groups of a pixel array 110.

Referring to FIG. 9A, the image sensor 100I according to an example embodiment may include a first lens 911A and a second lens 912A, each formed to correspond to two pixels adjacent to each other in a first direction (for example, an x-direction) in different pixel groups.

For example, the image sensor 100I may include a first lens 911A formed to correspond to a second pixel PX2 of the first pixel group 311 and a fifth pixel PX5 of the second pixel group 312. In addition, the image sensor 100I may include a second lens 912A formed to correspond to a fourth pixel PX4 of the first pixel group 311 and a seventh pixel PX7 of the second pixel group 312.

Referring to FIG. 9B, the image sensor 100J according to an example embodiment may include a first lens 911B and a second lens 912B formed to correspond to two pixels adjacent to each other in a second direction (for example, a y-direction) in different pixel groups.

For example, the image sensor 100J may include a first lens 911B formed to correspond to a seventh pixel PX7 of the second pixel group 312 and a thirteenth pixel PX13 of the fourth pixel group 314. In addition, the image sensor 100J may include a second lens 912B formed to correspond to an eighth pixel PX8 of a second pixel group 312 and a fourteenth pixel PX14 of a fourth pixel group 314.

According to an example embodiment, the readout circuit 140 may obtain a first phase signal from at least a portion of two pixels corresponding to the first lenses 911A and 911B. In addition, the readout circuit 140 may obtain a second phase signal from at least a portion of two pixels corresponding to the second lenses 912A and 912B.

Referring to FIG. 9A, the readout circuit 140 may obtain a first phase signal through the first lens 911A and the second pixel PX2 or the fifth pixel PX5, and may obtain a second phase signal through the second lens 912A and the fourth pixel PX4 or the seventh pixel PX7. For example, the readout circuit 140 may obtain the first phase signal through the first lens 911A and the second pixel PX2, and may obtain the second phase signal through the second lens 912A and the seventh pixel PX7.

Referring to FIG. 9B, the readout circuit 140 may obtain a first phase signal through the first lens 911B and the seventh pixel PX7 or the thirteenth pixel PX13, and may obtain a second phase signal through the second lens 912B and the eighth pixel PX8 or the fourteenth pixel PX14. For example, the readout circuit 140 may obtain the first phase signal through the first lens 911B and the seventh pixel PX7, and may obtain the second phase signal through the second lens 912B and the eighth pixel PX8.

The readout circuit 140 may output phase data PDAT based on the first phase signal and the second phase signal through the phase data generator 142.

For example, the phase data generator 142 may generate phase data PDAT by synthesizing the first phase signal and the second phase signal. The readout circuit 140 may output the generated phase data PDAT. In this case, the phase data PDAT may include information related to a focal length to the subject.

The image signal processor 160 may perform autofocusing based on the phase data PDAT received from the readout circuit 140.

In addition, the readout circuit 140 may obtain color signals from pixels of the pixel array 110, other than pixels corresponding to the first lenses 911A and 911B and the second lenses 912A and 912B.

For example, the readout circuit 140 may obtain color signals from pixels, other than the second pixel PX2, the fourth pixel PX4, the fifth pixel PX5, and the seventh pixel PX7 of the pixel array 110. For example, the readout circuit 140 may obtain color signals from pixels, other than the seventh pixel PX7, the eighth pixel PX8, the thirteenth pixel PX13, and the fourteenth pixel PX14 of the pixel array 110.

Moreover, the readout circuit 140 may output image data IDAT through the image data generator 141 based on the color signals.

For example, the image data generator 141 may generate image data IDAT by synthesizing the received color signals. The readout circuit 140 may output the generated image data IDAT.

Thus, the image sensors 100I and 100J according to example embodiments may perform autofocusing on the subject based on the signal received through the pixel array 110. In addition, the image sensors 100I and 100J may generate an image of the subject.

As a result, the image sensors 100I and 100J may improve performance of the autofocusing for the subject. In addition, the image sensors 100I and 100J may improve quality and/or resolution of the generated image.

FIG. 10 is a diagram illustrating a first lens formed to correspond to four pixels included in two different pixel groups of the pixel array of FIG. 2, according to an example embodiment.

Referring to FIG. 10, an image sensor 100K according to an example embodiment may include a first lens 1011 formed to correspond to four pixels included in two different pixel groups of the pixel array 110.

For example, the image sensor 100K may include a first lens 1011 formed to correspond to four pixels arranged in a 2×2 matrix in two different pixel groups.

For example, the image sensor 100K may include a first lens 1011 formed to correspond to a second pixel PX2, a fourth pixel PX4, a fifth pixel PX5, and a seventh pixel PX7. In this case, the second pixel PX2 and the fourth pixel PX4 may be included in a first pixel group 311. In addition, the fifth pixel PX5 and the seventh pixel PX7 may be included in a second pixel group 312.

According to an example embodiment, the readout circuit 140 may obtain a first phase signal and a second phase signal from at least a portion of the four pixels corresponding to the first lens 1011.

For example, the readout circuit 140 may obtain the first phase signal through at least a portion of the second pixel PX2 and the fourth pixel PX4, and may obtain the second phase signal through at least a portion of the fifth pixel PX5 and the seventh pixel PX7.

For example, the readout circuit 140 may obtain the first phase signal through the second pixel PX2 in response to a first control signal (for example, a timing control signal) received from the timing controller 150. In addition, the readout circuit 140 may obtain the second phase signal through the seventh pixel PX7 in response to a second control signal, subsequent to the first control signal and received from the timing controller 150.

Moreover, the readout circuit 140 may output phase data PDAT through the phase data generator 142 based on the first phase signal and the second phase signal.

For example, the phase data generator 142 may generate phase data PDAT by comparing the first phase signal and the second phase signal. The readout circuit 140 may output the generated phase data PDAT. In this case, the phase data PDAT may include information related to a focal length to the subject.

The image signal processor 160 may perform autofocusing based on the phase data PDAT received from the readout circuit 140.

In addition, the readout circuit 140 may obtain color signals from pixels of the pixel array 110, other than pixels corresponding to the first lens 1011.

For example, the readout circuit 140 may obtain color signals from pixels other than the second pixel PX2, the fourth pixel PX4, the fifth pixel PX5, and the seventh pixel PX7 of the pixel array 110.

Moreover, the readout circuit 140 may output image data IDAT through the image data generator 141 based on the color signals.

For example, the image data generator 141 may generate image data IDAT by synthesizing the received color signals. The readout circuit 140 may output the generated image data IDAT.

Thus, the image sensor 100K according to example embodiment may perform autofocusing on the subject based on the signal received through the pixel array 110. In addition, the image sensor 100K may generate an image of the subject.

As a result, the image sensor 100K may improve performance of the autofocusing for the subject. In addition, the image sensor 100K may improve quality and/or resolution of the generated image.

FIG. 11 is a diagram illustrating a first lens formed to correspond to four pixels included in four different pixel groups of the pixel array of FIG. 2, according to an example embodiment.

Referring to FIG. 11, an image sensor 100L according to an example embodiment may include a first lens 1111 formed to correspond to four pixels included in different pixel groups of a pixel array 110.

For example, the image sensor 100L may include a first lens 1111 formed to correspond to four pixels arranged in a 2×2 matrix in four different pixel groups.

For example, the image sensor 100L includes a first lens 1111 formed to correspond to a fourth pixel PX4, a seventh pixel PX7, a tenth pixel PX10, and a thirteenth pixel PX13. In this case, the fourth pixel PX4 may be included in a first pixel group 311. In addition, the seventh pixel PX7 may be included in a second pixel group 312. In addition, the tenth pixel PX10 may be included in a third pixel group 313. Additionally, the thirteenth pixel PX13 may be included in a fourth pixel group 314.

According to an example embodiment, the readout circuit 140 may obtain a first phase signal and a second phase signal from at least a portion of the four pixels corresponding to the first lens 1111.

For example, the readout circuit 140 may obtain the first phase signal through at least a portion of the fourth pixel PX4 and the tenth pixel PX10, and may obtain the second phase signal through a portion of the seventh pixel PX7 and the thirteenth pixel PX13.

For example, the readout circuit 140 may obtain the first phase signal through the fourth pixel PX4 in response to a first control signal (for example, a timing control signal) received from a timing controller 150. In addition, the readout circuit 140 may obtain a second phase signal through the thirteenth pixel PX13 in response to a second control signal, subsequent to the first control signal and received from the timing controller 150.

Moreover, the readout circuit 140 may output phase data PDAT through the phase data generator 142 based on the first phase signal and the second phase signal.

For example, the phase data generator 142 may generate phase data PDAT by comparing the first phase signal and the second phase signal. The readout circuit 140 may output the generated phase data PDAT. In this case, the phase data PDAT may include information related to a focal length to the subject.

The image signal processor 160 may perform autofocusing based on the phase data PDAT received from the readout circuit 140.

In addition, the readout circuit 140 may obtain color signals from pixels of the pixel array 110, other than pixels corresponding to the first lens 1111.

For example, the readout circuit 140 may obtain color signals from pixels, other than the fourth pixel PX4, the seventh pixel PX7, the tenth pixel PX10, and the thirteenth pixel PX13 of the pixel array 110.

Moreover, the readout circuit 140 may output image data IDAT based on the color signals through the image data generator 141.

For example, the image data generator 141 may generate image data IDAT by synthesizing the received color signals. The readout circuit 140 may output the generated image data IDAT.

Thus, the image sensor 100L according to example embodiments may perform autofocusing on the subject based on the signal received through the pixel array 110. In addition, the image sensor 100L may generate an image of the subject.

As a result, the image sensor 100L may improve performance of the autofocusing for the subject. In addition, the image sensor 100L may improve quality and/or resolution of the generated image.

As described above, the image sensor 100 according to example embodiments may significantly reduce signal interference between the phase signal and the color signal received from the pixel array 110.

In addition, the image sensor 100 according to example embodiments may significantly reduce signal interference between phase signals obtained through different lenses within a specific pixel group.

In addition, the image sensor 100 according to example embodiments may significantly reduce signal interference between the phase signal and the color signal to improve signal quality of the phase signal and the color signal.

In addition, the image sensor 100 according to example embodiments may improve performance of autofocusing using phase data generated based on a phase signal.

In addition, the image sensor 100 according to example embodiments may improve quality of a color signal to improve quality and/or resolution of an image generated through the image sensor 100.

As set forth above, according to example embodiments, signal quality of a phase signal and a color signal received through a pixel array may be improved.

In some example embodiments, each of the components represented by a block as illustrated in FIG. 1 may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been shown and described above, it will be apparent to those skilled in the art that modifications and variations could be made without departing from the scope of the present inventive concept as defined by the appended claims.

What is claimed is:

1. An image sensor comprising:

a first pixel group comprising a first pixel, a second pixel, a third pixel and a fourth pixel arranged in a 2×2 matrix;

a second pixel group comprising a fifth pixel, a sixth pixel, a seventh pixel and an eighth pixel arranged in a 2×2 matrix, wherein the second pixel group is provided adjacent to the first pixel in a first direction;

a first floating diffusion node provided in a location corresponding to a center of the first pixel group, wherein the first floating diffusion node is connected to the first pixel, the second pixel, the third pixel and the fourth pixel;

a first lens corresponding to the first pixel and the second pixel;

a second lens corresponding to the third pixel and the fourth pixel;

a device isolation pattern electrically isolating the first pixel group from the second pixel group; and a readout circuit configured to:

output phase data based on at least a portion of phase signals received from the first pixel group; and output image data based on at least a portion of color signals received from the second pixel group, wherein the device isolation pattern comprises a plurality of portions which electrically separate the first pixel, the second pixel, the third pixel, and the fourth pixel from each other, and wherein each of the plurality of portions is spaced apart from the center of the first pixel group.

2. The image sensor of claim 1, wherein the readout circuit is further configured to:

obtain a first phase signal based on at least a portion of a first pixel signal received from the first pixel and a second pixel signal received from the second pixel;

obtain a second phase signal based on at least a portion of a third pixel signal received from the third pixel and a fourth pixel signal received from the fourth pixel; and obtain the phase data based on the first phase signal and the second phase signal.

3. The image sensor of claim 2, further comprising:

a third pixel group comprising a ninth pixel, a tenth pixel, an eleventh pixel and a twelfth pixel arranged in a 2×2 matrix, wherein the third pixel group is provided adjacent to the first pixel group in a second direction intersecting the first direction; and a fourth pixel group comprising a thirteenth pixel, a fourteenth pixel, a fifteenth pixel and a sixteenth pixel arranged in a 2×2 matrix, wherein the fourth pixel group is provided adjacent to the second pixel group in the second direction, wherein the readout circuit is further configured to receive a color signal from pixels included in the second pixel group and the fourth pixel group, and output the image data based on.

4. The image sensor of claim 3, wherein the readout circuit is further configured to:

selectively operate in first mode or second mode based on intensity of light received through a plurality of pixels, and in the first mode:

receive first color signals, respectively assigned to the fifth pixel, the sixth pixel, the seventh pixel, the eighth pixel, the ninth pixel, the tenth pixel, the eleventh pixel, the twelfth pixel, the thirteen pixel, the fourteenth pixel, the fifteenth pixel and the sixteenth pixel; and obtain the image data based on the first color signals.

5. The image sensor of claim 4, wherein the readout circuit is further configured, in the second mode, to:

obtain second color signals, respectively assigned to the fifth pixel, the sixth pixel, the seventh pixel, the eighth pixel, the ninth pixel, the tenth pixel, the eleventh pixel, the twelfth pixel, the thirteen pixel, the fourteenth pixel, the fifteenth pixel and the sixteenth pixel; and obtain the image data based on the second color signals.

6. The image sensor of claim 4, further comprising:

a fifth pixel group comprising a seventeenth pixel, an eighteenth pixel, a nineteenth pixel and a twentieth pixel arranged in a 2×2 matrix, wherein the fifth pixel group is provided adjacent to the second pixel in the first direction;

a third lens corresponding to the seventeenth pixel and the eighteenth pixel; and a fourth lens corresponding to the nineteenth pixel and the twentieth pixel.

7. The image sensor of claim 6, wherein the readout circuit is further configured, in the second mode, to:

obtain a third phase signal based on at least a portion of the first pixel signal, the second pixel signal, the third pixel signal and the fourth pixel signal;

obtain a fourth phase signal based on at least a portion of an eighteenth pixel signal received from the eighteenth pixel, a nineteenth pixel signal received from the nineteenth pixel and a twentieth pixel signal received from the twentieth pixel; and obtain the phase data based on the third phase signal and the fourth phase signal.

8. The image sensor of claim 1, wherein the plurality of portions comprises:

a first portion extending in a second direction, intersecting the first direction, between the first pixel and the second pixel;

a second portion extending in the first direction, between the second pixel and the fourth pixel;

a third portion extending in the second direction, between the third pixel and the fourth pixel; and a fourth portion extending in the first direction between the first pixel and the third pixel.

9. An image sensor comprising:

a first pixel group, a second pixel group, a third pixel group and a fourth pixel group provided in a 2×2 matrix, each comprising pixels arranged in a 2×2 matrix;

a fifth pixel group comprising pixels arranged in a 2×2 matrix and provided adjacent to the fourth pixel group; and a readout circuit configured to:

output phase data based on a first phase signal and a second phase signal, obtained from at least a portion of pixel signals of the first pixel group, in a first mode; and output the phase data based on a third phase signal, obtained from at least a portion of the pixel signals of the first pixel group, and a fourth phase signal, obtained from at least a portion of pixel signals of the fifth pixel group, in a second mode.

10. The image sensor of claim 9, further comprising a device isolation pattern electrically separating the first pixel group, the second pixel group, the third pixel group, the fourth pixel group and the fifth pixel group from each other, wherein the device isolation pattern comprises a plurality of portions which electrically separate a first pixel, a second pixel, a third pixel, and a fourth pixel of the first pixel group, and wherein each of the plurality of portions is spaced apart from a center of the first pixel group.

11. The image sensor of claim 10, wherein the readout circuit is further configured to:

receive first color signals, respectively corresponding to pixels of the second pixel group, the third pixel group and the fourth pixel group, and output image data, in the first mode; and receive second color signals, respectively corresponding to pixels of the second pixel group, the third pixel group and the fourth pixel group, and output the image data, in the second mode.

12. The image sensor of claim 10, comprising:

a first lens corresponding to the first pixel and the second pixel; and a second lens corresponding to the third pixel and the fourth pixel, wherein the readout circuit is further configured, in the first mode, to:

obtain the first phase signal based on at least a portion of a first pixel signal received from the first pixel, and a second pixel signal received from the second pixel; and obtain the second phase signal based on at least a portion of a third pixel signal received from the third pixel, and a fourth pixel signal received from the fourth pixel.

13. The image sensor of claim 12, further comprising a third lens and a fourth lens, each corresponding, respectively, to two pixels of the fifth pixel group, wherein the readout circuit is further configured, in the second mode, to:

obtain the third phase signal from a pixel signal corresponding to the third lens or the fourth lens, and at least a portion of the first pixel signal, the second pixel signal, the third pixel signal and the fourth pixel signal; and obtain the fourth phase signal from a pixel signal corresponding to the third lens or the fourth lens, and at least a portion of the first pixel signal, the second pixel signal, the third pixel signal and the fourth pixel signal.

14. The image sensor of claim 9, comprising an image signal processor electrically connected to the readout circuit, wherein the image signal processor is configured to determine a focus based on the phase data received from the readout circuit.

15. The image sensor of claim 10, wherein the plurality of portions comprises:

a first portion extending in a second direction, intersecting a first direction, between the first pixel and the second pixel;

a second portion extending in the first direction between the second pixel and the fourth pixel;

a third portion extending in the second direction between the third pixel and the fourth pixel; and a fourth portion extending in the first direction between the first pixel and the third pixel, and wherein the image sensor further comprises a floating diffusion node electrically connected to the first pixel, the second pixel, the third pixel and the fourth pixel.

16. The image sensor of claim 15, wherein the first portion, the second portion, the third portion and the fourth portion are spaced apart from the floating diffusion node, wherein the floating diffusion node is at a location corresponding to the center of the first pixel group, and wherein the first pixel, the second pixel, the third pixel, and the fourth pixel are electrically connected to the floating diffusion node.

17. An image sensor comprising:

a first pixel group comprising a first pixel, a second pixel, a third pixel and a fourth pixel arranged in a 2×2 matrix;

a second pixel group comprising a fifth pixel, a sixth pixel, a seventh pixel and an eighth pixel arranged in a 2×2 matrix, wherein the second pixel group is provided adjacent to the first pixel group;

a first floating diffusion node provided in a location corresponding to a center of the first pixel group, wherein the first floating diffusion node is connected to the first pixel, the second pixel, the third pixel and the fourth pixel;

a first lens corresponding to at least two pixels, among pixels of the first pixel group and the second pixel group;

a device isolation pattern electrically separating the pixels of the first pixel group and the second pixel group from each other; and a readout circuit electrically connected to a plurality of pixels, wherein the device isolation pattern comprises a plurality of portions electrically separating the first pixel, the second pixel, the third pixel, and the fourth pixel from each other, wherein each of the plurality of portions is spaced apart from the center of the first pixel group, and wherein the readout circuit is configured to:

output phase data based on at least a portion of phase signals corresponding to the first lens; and output image data based on color signals received from pixels that are offset from the first lens, among the plurality of pixels.

18. The image sensor of claim 17, wherein the first lens corresponds to the first pixel and the second pixel, and wherein the readout circuit is further configured to output the phase data based on a first phase signal, obtained through the first pixel, and a second phase signal obtained through the second pixel.

* * * * *